United States Patent
Dong

(10) Patent No.: US 7,103,830 B1
(45) Date of Patent: Sep. 5, 2006

(54) DC BALANCED ERROR CORRECTION CODING

(75) Inventor: Wei Dong, Apex, NC (US)

(73) Assignee: Applied Micro Circuits Corporation, San Diego, CA (US)

( * ) Notice: Subject to any disclaimer, the term of this patent is extended or adjusted under 35 U.S.C. 154(b) by 514 days.

(21) Appl. No.: 10/324,615

(22) Filed: Dec. 18, 2002

(51) Int. Cl.
H03M 13/21 (2006.01)
H03M 13/09 (2006.01)

(52) U.S. Cl. .................... 714/784; 714/781
(58) Field of Classification Search ........ 714/784; H03M 13/09, 13/21
See application file for complete search history.

(56) References Cited

U.S. PATENT DOCUMENTS

| | | | | |
|---|---|---|---|---|
| 4,162,480 | A | 7/1979 | Berlekamp | 340/146.1 |
| 4,486,739 | A | 12/1984 | Franaszek et al. | 340/347 |
| 5,144,304 | A * | 9/1992 | McMahon et al. | 341/58 |
| 5,414,719 | A | 5/1995 | Iwaki et al. | 371/37.1 |
| 5,687,181 | A | 11/1997 | Suemura et al. | 371/37.6 |
| 6,430,201 | B1 * | 8/2002 | Azizoglu et al. | 370/535 |
| 6,654,565 | B1 * | 11/2003 | Kenny | 398/182 |
| 2003/0202610 | A1 * | 10/2003 | Terada et al. | 375/259 |

OTHER PUBLICATIONS

A. X. Widmer, P.A. Franaszek, "A DC-Balanced, Partitioned-Block, 8B/10B Transmission Code", IBM J. Res. Develop., vol. 27, No. 5, Sep. 1983, pp. 440-451.

A.N. Coles, Abstract, "A new 8B10B block code for high speed data transmission over un-shielded twisted pair channels", Hewlett-Packard Laboratories, (believed to be before Dec. 2002), pp. 1-5.

"8b10b Macro", V 2.0, Actel Corporation, May 2000, pp. 1-9.

Email from Jerry Hauck, dated May 8, 1997, Subject: 8B/10B bit order and CRC impact, http://www.zayante.com/p1394b/old/jh970506-8B10B-bit-order.txt, pp. 1-5.

(Continued)

Primary Examiner—R. Stephen Dildine
(74) Attorney, Agent, or Firm—Silicon Valley Patent Group LLP

(57) ABSTRACT

Two types of codings are integrated, instead of performing each coding independently. The two codings may be integrated by interleaving one or more acts of one coding method (e.g. data coding) between two or more acts of the other coding method (e.g. line coding). In some embodiments, partitioning of a block of data (e.g. a byte) for line coding (e.g. DC balance coding) is done prior to data coding (e.g. error correction coding). In such embodiments, the remaining acts of line coding may be performed after the data coding is completed. In one particular embodiment, an 8 bit byte is not directly used in error correction coding and instead, the 8 bit byte is initially partitioned into two sub-blocks (of 3 bits and 5 bits) as required by 8B/10B encoding (which is an example of line coding). After partitioning, the 8B/10B encoding is not continued, and instead Reed Solomon coding (which is an example of data coding) is then performed (to completion) on the individual sub-blocks (of 3 bits and 5 bits). The error correction coded sub-blocks (of 3 bits and 5 bits) are then used for the remainder of 8B/10B encoding.

20 Claims, 11 Drawing Sheets

OTHER PUBLICATIONS

James S. Plank, Abstract, "A Tutorial on Reed-Solomon Coding for Fault-Tolerance in RAID-like Systems", Department of Computer Science, University of Tennessee, Feb. 19, 1999, pp. 1-19.
"Encoder / Decoder", (believed to be before Dec. 2002), pp. 1-3, http://iram.cs.berkeley.edu/serialio/cs254/enc_dec/.
Shu Lin, Daniel J. Costello, Jr., "Error Control Coding Fundamentals and Applications", 1983 by Prentice-Hall, Inc. Englewood Cliffs, New Jersey 07632, (ISBN 0-13-283796-X) pp. 29-32.
Stephen G. Wilson, "Digital modulation and Coding", © 1996 by Prentice-Hall, Inc., (ISBN 7-5053-4881-7), pp. 452-453, 470-473.
IEEE standard 802.3, CSMA/CD, 1998 edition, pp. 927-940.
Stephen B. Wicker and Vijay K. Bhargava, "Reed-Solomon Codes and Their Application", Chapter 5, IEEE Press 1994, (ISBN:0-7803-5391-9), pp. 60-107.
C. Benz, M. Gowan and K. Springer, "An Error Correcting Encoder and Decoder for a 1 Gbit/s Fiber Optic Link", Proc. IEEE 1991, Custom Integrated Circuits Conference, 7.1.1-7.1.4, San Diego, May 1991.
K. Springer, "A Forward Error Correcting Code for Gigabit Fiber Optic Links", Proc. SPIE—Int. Soc. Opt. Eng. (USA), vol. 1577, 1992, pp. 246-253.

* cited by examiner

DC BALANCED ERROR CORRECTION CODING

CROSS-REFERENCE TO COMPUTER PROGRAM LISTING APPENDIX

Appendix A contains the following files in one CD-ROM in IBM-PC format and compatible with Microsoft Windows (of which two identical copies are attached hereto). Appendix A is a part of the present disclosure and is incorporated by reference herein in its entirety.

Volume in drive D is 021217_1547
Volume Serial Number is 0C9A-8EF4
Directory of D:\

| | | |
|---|---|---|
| 12/16/2002 09:36a | 1,756 | COMBIN32.TXT |
| 12/16/2002 09:36a | 1,755 | COMBIN8.TXT |
| 12/16/2002 09:36a | 3,342 | ECORR32.TXT |
| 12/16/2002 09:36a | 3,082 | ECORR8.TXT |
| 12/16/2002 09:36a | 13,658 | ELOC32.TXT |
| 12/16/2002 09:36a | 6,346 | ELOC8.TXT |
| 12/16/2002 09:36a | 2,208 | LFSREN32.TXT |
| 12/16/2002 09:36a | 2,720 | LFSREN8.TXT |
| 12/16/2002 09:36a | 1,795 | LUT32T1.TXT |
| 12/16/2002 09:36a | 1,799 | LUT32T18.TXT |
| 12/16/2002 09:36a | 732 | LUT8T1.TXT |
| 12/16/2002 09:36a | 732 | LUT8T3.TXT |
| 12/16/2002 09:36a | 1,194 | RSDEC32.TXT |
| 12/16/2002 09:36a | 1,039 | RSDEC8.TXT |
| 12/16/2002 09:36a | 1,876 | RXSHUF32.TXT |
| 12/16/2002 09:36a | 1,875 | RXSHUF8.TXT |
| 12/16/2002 09:36a | 1,765 | SFORM32.TXT |
| 12/16/2002 09:36a | 1,759 | SFORM8.TXT |
| 12/16/2002 09:36a | 5,049 | TC_ALL32.TXT |
| 12/16/2002 09:36a | 4,281 | TC_ALL8.TXT |
| 12/16/2002 09:36a | 2,688 | TC_EN32.TXT |
| 12/16/2002 09:36a | 2,648 | TC_EN8.TXT |
| 22 File(s) | 64,099 bytes | |

Total Files Listed:
22 File(s) 64,099 bytes
0 Dir(s) 0 bytes free

The files of Appendix A form source code of computer programs (in the form of hardware description language, Verilog) for implementing certain circuitry used in an illustrative embodiment of the present invention, containing Galois Field 32 and Galois Field 8 Reed-Solomon encoders and decoders. All files in Appendix A are in Verilog and provide a behavioral description of the encoders and decoders used in one specific illustrative embodiment.

COPYRIGHT NOTICE

A portion of the disclosure of this patent document contains material which is subject to copyright protection. The copyright owner has no objection to the facsimile reproduction by anyone of the patent document or the patent disclosure, as it appears in the patent and trademark office patent files or records, but otherwise reserves all copyright rights whatsoever.

BACKGROUND OF THE INVENTION

Line coding is normally used to match the characteristics of a signal that is to be transmitted with characteristics of a channel over which the signal will be transmitted, e.g. to limit the DC contents of the signal and/or to facilitate clock recovery. Examples of line coding methods well known in the prior art are: Return to zero, NRZI non-return to zero invert on ones, Manchester encoding, Bi-Phase Mark, 3B/4B, 4B/5B, 5B/6B and 8B/10B, done in groups of bits before serialization.

U.S. Pat. No. 4,486,739 granted to Franaszek et al (that is incorporated by reference herein in its entirety) discloses an 8B/10B coder that is partitioned into a 5B/6B coder which encodes a 5 bit nibble, and a 3B/4B coder which encodes a 3 bit nibble. The 5 bit nibble is encoded to 6 bits and the 3 bit nibble is encoded to 4 bits. U.S. Pat. No. 4,486,739 states that it is desirable to encode 8 bits at a time in code words of 10 bits to be transmitted, rather than 4 into 5. However, according to U.S. Pat. No. 4,486,739 a nonlinear encoding of eight bits presents difficulties in implementation, as well as the likelihood that a single error in detection will result in eight erroneously decoded data bits.

These problems are solved via the partitioned block format described in U.S. Pat. No. 4,486,739: that is, the eight bits are encoded using coders producing less than 10 bit outputs. These coders interact so as to yield the desired code words. U.S. Pat. No. 4,486,739 describes the result as a coder whose coding rate, complexity and error propagation are near the theoretical limits, and which has ancillary benefits in flexibility of adaptation to various situations. Other partitions beside the 5/6, 3/4 were considered by the inventors of U.S. Pat. No. 4,486,739, but all were deemed to have disadvantages in error propagation and other criteria.

U.S. Pat. No. 4,486,739 also states that single errors or short error bursts in the encoded line digits of any block code can generate a longer error burst in the decoded message. For the 8B/10B code proposed in U.S. Pat. No. 4,486,739 the effects of line digit errors are always confined to the 6B or 4B sub-blocks in which they occur and generate error bursts no longer than 5 or 3, respectively, from a single line digit error. This derives from the fact, that each 6B or 4B sub-block is uniquely decodable on the basis of just the values belonging to that sub-block and without any reference to disparity or other extraneous parameters. See also an article by Widmer AX and Franaszek PA, entitled "A DC-balanced, partioned block, 8B/10B transmission code," IBM Journal of Research and Development, Vol. 27, no. 5, pp. 440–451, September, 1983 that is incorporated by reference herein in its entirety.

The above-described 8B/10B encoder can be used to encode signals that are generated by a Reed Solomon encoder as described in U.S. Pat. No. 5,687,181 granted to Suemura et al (that is incorporated by reference herein in its entirety). Specifically, U.S. Pat. No. 5,687,181 discloses in its FIG. 7 that a 64 bit parallel signal is divided into two parallel digital signals each of 8 byte width, with each byte being composed of 4 bits. The divided signals are inputted to two encoders for error correcting code. In the encoders, the parallel signal is encoded into a one byte error correcting Reed Solomon code wherein byte length is of 4 bits and code length is of 10 bytes.

According to U.S. Pat. No. 5,687,181, the parallel signal having 10 bytes in width outputted from the encoders is distributed with one byte in width being present in every ten transmitters by an interleaver. One byte is composed of 4 bits so that, in each transmitter, a signal having 4 bits in width is distributed from each of two encoders, and a parallel signal having a total of 8 bits in width is inputted. The transmitter comprises an 8B10B encoder, a parallel/serial converter and an optical transmitter. The parallel signal having 8 bits in width inputted thereto is encoded into 8B10B code and is converted into a parallel signal having 10 bits in width, which is then time-division multiplexed for transmission as one serial optical signal.

The following prior art references also provide background, and each of these prior art references is incorporated by reference herein in its entirety:

[1] Carrier sense multiple access with collision detection (CSMA/CD) access method and physical layer specifications, pp 927–940, IEEE Std 802.3, 1998 Edition

[2] Shu Lin, D. J. Costello Jr. Error Control Coding: Fundamentals and Applications, pp 29–33, 1983, Prentice-Hall

[3] S. B. Wilson, S. B. Wicker and V. K. Bhargava, Reed-Solomon Codes and Their Application, 1994, IEEE Press.

[4] C. Benz, M. Gowan and K. Springer. An Error Correcting Encoder and Decoder for a 1 Gbit/s Fiber Optic Link. Proc. IEEE 1991 Custom Integrated Circuits Conference, 7.1.1–7.1.4, San Diego, May 1991.

[5] K. Springer. A Forward Error Correcting Code for Gigabit Fiber Optic Links. Proc. SPIE—Int. Soc. Opt. Eng. (USA), vol. 1577, 1992, pp. 246–253. Conference on High-Speed Fiber Networks and Channels (1991), Boston, September 1991.

SUMMARY

A method and circuit integrate two types of codings, instead of performing each coding independent of the other coding. Two such codings that were formerly performed sequentially, are now integrated by interleaving one or more acts of one coding method (e.g. data coding) between two or more acts of the other coding method (e.g. line coding). In some embodiments, partitioning of a block of data (e.g. a byte) for line coding (e.g. DC balance coding) is done prior to data coding (e.g. error correction coding). In such embodiments, the remaining acts of line coding may be performed after the data coding is completed.

In one particular embodiment, an 8 bit block of data (i.e. a byte) is not directly used in error correction coding and instead, the 8 bit block is initially partitioned into two sub-blocks (of 3 bits and 5 bits) as required by 8B/10B encoding (which is an example of line coding). After the partitioning, the 8B/10B encoding is not continued, and instead Reed Solomon encoding (which is an example of data coding) is then performed (to completion) on the individual sub-blocks (of 3 bits and 5 bits). The just-described 8B/10B partitioning prior to Reed Solomon encoding simplifies the circuitry required to implement Reed Solomon encoding. In one particular example, generator polynomials for Reed Solomon encoding are selected to achieve small circuitry in a decoder. The Reed Solomon encoded sub-blocks (still of 3 bits and 5 bits) are then used in the remainder of 8B/10B encoding, in the normal manner (e.g. 3B/4B and 5B/6B encoding are respectively performed).

DETAILED DESCRIPTION

A method in accordance with the invention integrates data coding (e.g. error correction coding) with line coding (e.g. to match the characteristics of a signal that is to be transmitted with characteristics of a line), instead of performing each of these independently. Although the description refers to a line, it is to be understood that the coded data obtained by such an integrated method may be transmitted over any channel well known in the art.

Figure 1A:
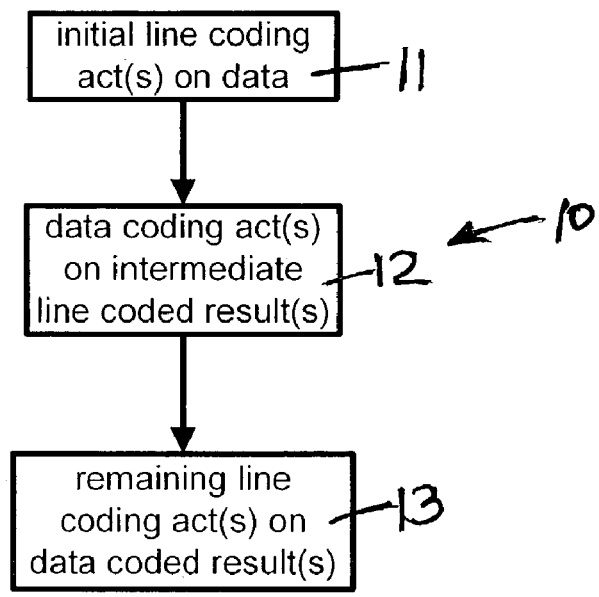
FIGS. 1A and 1B illustrate, in a flow chart and a circuit diagram respectively, integration of line coding and data coding in accordance with the invention.

Depending on the embodiment, two types of coding methods may be integrated by interleaving one or more acts of one type of coding method (such as data coding) among one or more acts of the other type of coding method (such as line coding). Specifically, as illustrated by an integrated coding method 10 in FIG. 1A, an initial act 11 of line coding that is normally performed in sequence with one or more remaining acts 13 of line coding is separated therefrom in accordance with the invention by one or more acts 12 of data coding. Therefore, data coding acts 12 are performed on one or more intermediate results generated by one or more initial acts 11 of line coding. Furthermore, one or more outputs of data coding in acts 12 are used in one or more remaining acts 13 of line coding.

Figure 1B:
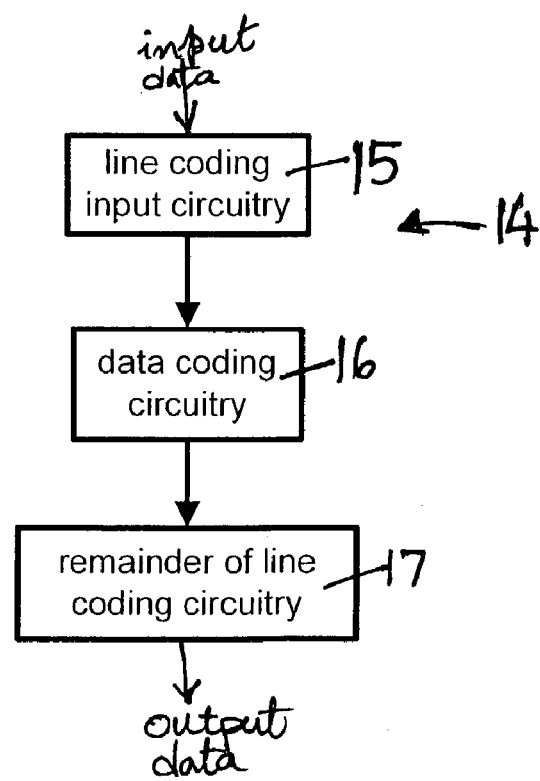

Although the preceding paragraph illustrates integration of methods of data coding and line coding, it will be apparent to the skilled artisan that circuitry for implementing such methods is correspondingly integrated in a similar or identical manner, e.g. as illustrated in FIG. 1B. Specifically, input circuitry 15 that is normally used to implement line coding is separated from remainder circuitry 17 of line coding, and data coding circuitry 16 is inserted therebetween, to yield integrated coding circuitry 14.

Figure 2A:
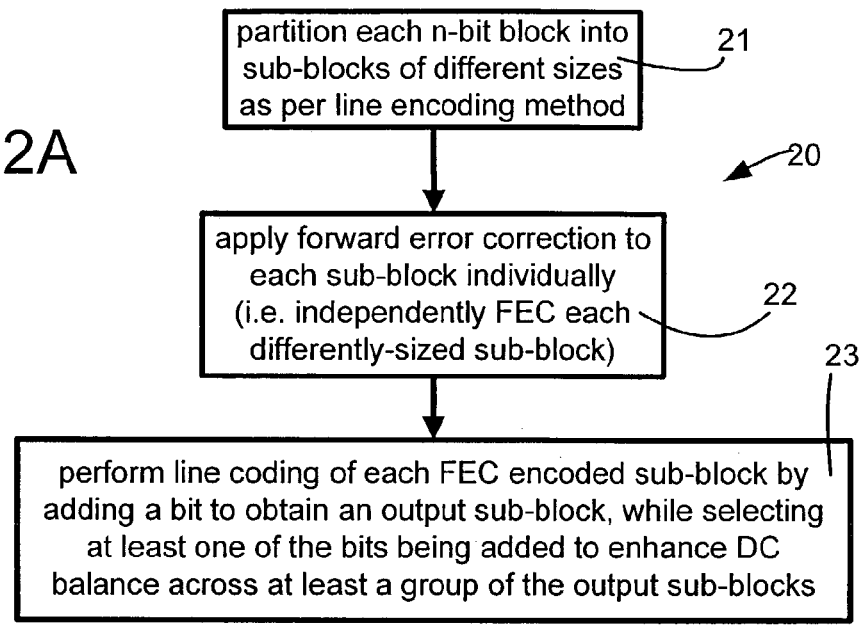
FIGS. 2A and 2B illustrate, in a flow chart and a circuit diagram respectively, some embodiments of the corresponding items in FIGS. 1A and 1B respectively.

Prior to performing any act of a data coding method (such as forward error correction "FEC" encoding), several embodiments in accordance with the invention initially perform a line coding act, of partitioning an n-bit word that is received as input into two or more sub-blocks of different sizes (see act 21 in FIG. 2A). Thereafter, FEC encoding is performed on each different-sized sub-block individually (see act 22 in FIG. 2A). The just-described FEC encoding on any sub-block is performed independent of a corresponding FEC encoding on any other sub-block. Since the FEC encoding is performed independently on the various sub-blocks (instead of being performed on the whole block), the sub-blocks can be encoded concurrently. Furthermore, circuitry for encoding the sub-blocks is smaller than the corresponding circuitry for encoding a whole block, because fewer bits are involved when encoding sub-blocks.

After data coding of the different-sized sub-blocks, the integrated coding method 20 performs the remainder of line coding in an act 23 (FIG. 2A) on the results of act 22. An example of act 23 adds one or more bit(s) to the results of act 22, to obtain an output sub-block for each result, i.e. for each different-sized FEC-encoded sub-block. Depending on the embodiment, the one or more bit(s) that are added may be selected to enhance a line characteristic, such as DC balance. The results of data coding in act 22 that are used as inputs in act 23 are of an appropriate size for act 23 because one or more acts 21 of line code based partitioning are performed initially in accordance with the invention, prior to data coding acts 22.

In a group of embodiments, the partitioning of a block of n bits in act 21 results in only two sub-blocks (although in other embodiments such partitioning may result in multiple sub-blocks). Assuming that the two sub-blocks have x bits and n-x bits, these sub-blocks are FEC encoded independent of each other in act 22, and the results of FEC encoding (also called "intermediate" results) are also of x bits and n-x bits.

Figure 2B:
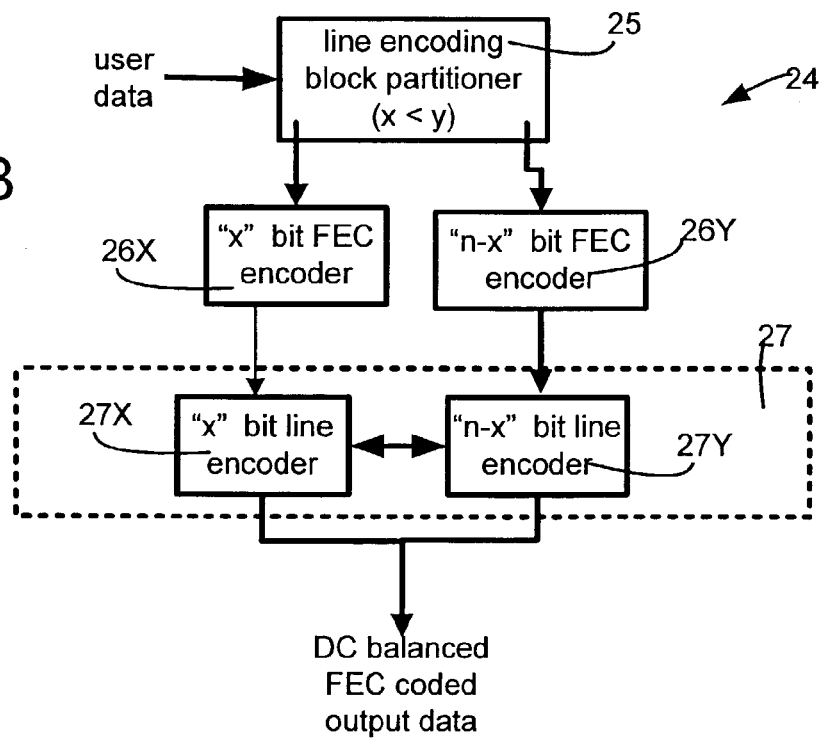

Circuitry for implementing such a group of embodiments is illustrated in FIG. 2B, wherein a block partitioner 25 partitions input data (also called "user data") into a form required for line coding. Block partitioner 25 of this group of embodiments generates an x bit block and a n-x bit block wherein x is not n/2. Block partitioner 25 is coupled to an x bit FEC encoder 26× and a n-x bit FEC encoder 26Y. Each of x bit FEC encoder 26× and n-x bit FEC encoder 26Y operate independent of each other on their respective x bit and n-x bit input data.

In certain embodiments, each of x bit FEC encoder 26× and n-x bit FEC encoder 26Y are coupled to supply their results (also called "intermediate results") to an x bit line coder 27X and a n-x bit line coder 27Y respectively. In these embodiments, encoder 26X that performs data coding and encoder 27X that performs the remainder of line coding both process data of the same width, i.e. x bits wide. Same is true for data encoder 26Y and line encoder 27Y, i.e. both process data of the same width (n-x bits wide) in these embodiments, although in other embodiments this relationship is not observed.

In several embodiments, the x bit line coder 27X and the n-x bit line coder 27Y are coupled to one another to exchange information as necessary to implement line coding. Note that in other embodiments, the x bit line coder 27X and n-x bit line coder 27Y may be replaced by a combinational logic 27 (shown by a dashed box in FIG. 2B) that performs the remainder of line coding to obtain the line coded (and FEC coded) output, such as a DC balanced FEC coded output. Therefore, combinational logic 27 represents an embodiment that does not observe the relationship described in the previous paragraph. When combinational logic 27 is used, partitioner 25 performs the partition that is required by logic 27 (e.g. the user data may be partitioned into three or more sub-blocks, depending on the circuitry in logic 27).

Figure 3A:
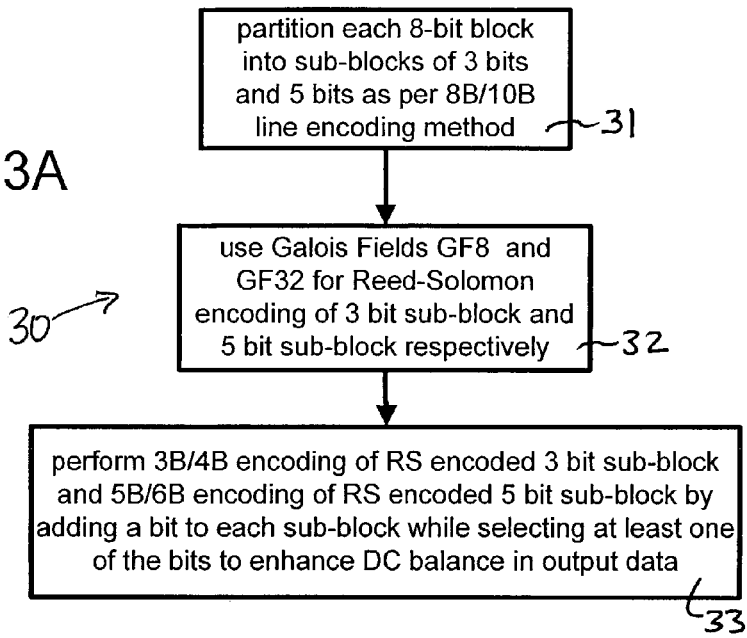
FIGS. 3A and 3B illustrate, in a flow chart and a circuit diagram respectively, some examples of the corresponding items in FIGS. 2A and 2B respectively.
Figure 3B:
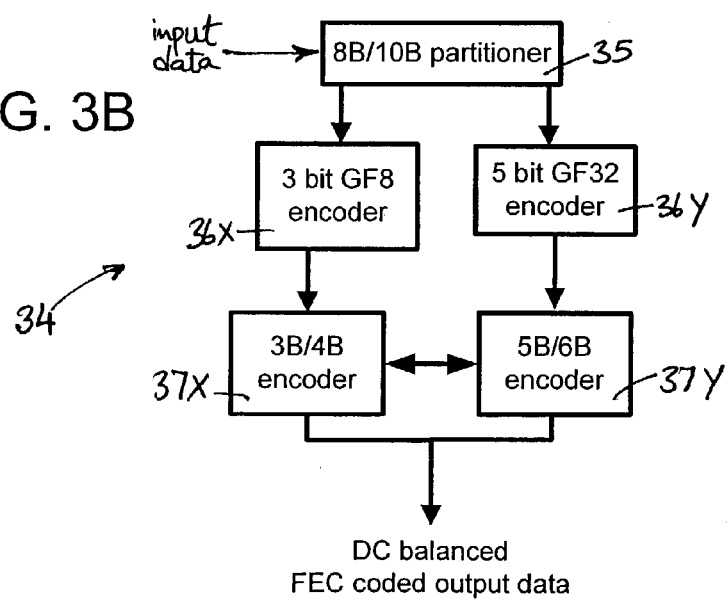

Exemplary embodiments illustrated in FIGS. 3A and 3B receive parallel data in the form of 8 bit words as input. However, an 8 bit word (also called "byte") received as input is not directly used in error correction coding and instead, the 8 bit byte is partitioned into two sub-blocks (of 3 bits and 5 bits), in a first step of line coding described in U.S. Pat. No. 4,486,739 granted to Franaszek et al (that has been incorporated by reference above). The partitioning is performed even before any data coding is done. Specifically, in act 31 (which may be performed in a partitioner 35), the 8 bit input word is partitioned as per 8B/10B encoding into a 3 bit sub-block and a 5 bit sub-block.

After partitioning, the 8B/10B encoding is not continued, and instead error correction coding is performed (to completion) on the individual sub-blocks (of 3 bits and 5 bits). Specifically, in act 32 (FIG. 3A), data coding is performed by applying Galois Fields GF8 and GF32 independently to the 3 bit sub-block and 5 bit sub-block to perform Reed Solomon ("RS") encoding of each sub-block (which may be performed in GF8 encoder 36X and GF32 encoder 36Y). Use of Galois Fields in Reed-Solomon encoders is well known in the art, as described, for example in the following references, each of which is incorporated by reference herein in its entirety:

(1) U.S. Pat. No. 4,162,480 granted to Berlekamp;
(2) U.S. Pat. No. 5,414,719 granted to Iwaki, et al; and
(3) Article entitled "A Tutorial on Reed-Solomon Coding for Fault-Tolerance in RAID-like Systems" by James S. Plank, Feb. 19, 1999.

In certain embodiments, the RS encoding of the sub-block of 3 bits is based on Galois Field GF8 with a primitive polynomial selected to be either of 1101 and 1011, and the RS encoding of the sub-block of 5 bits is based on Galois Field GF32 with a primitive polynomial selected to be any of 101001, 100101, 111101, 111011, 110111 and 101111. Such embodiments can correct up to two symbol errors if one symbol error is in the GF8 channel and another symbol error is in the GF32 channel, even if the errors happen in adjacent bytes.

Error correction coded sub-blocks (which are still of 3 bits and 5 bits) are then used for the remainder of 8B/10B encoding. Specifically, line coding is resumed in act 33 (FIG. 3A), wherein 3B/4B encoding is performed on the 3 bit result of RS encoding (e.g. in 3B/4B encoder 37X), and furthermore 5B/6B encoding is performed on the 5 bit result of RS encoding (e.g. in 5B/6B encoder 37Y). The 3B/4B and the 5B/6B encodings are performed in the normal manner by adding 1 bit to each result, to obtain a 4 bit output sub-block and a 6 bit output sub-block respectively. At least one of the two bits being added in act 33 are selected to improve line conditioning, e.g. to enhance DC balance in the overall 10 bit output, i.e. across the entirety of 4 bit and 6 bit output sub-blocks.

Figure 4:
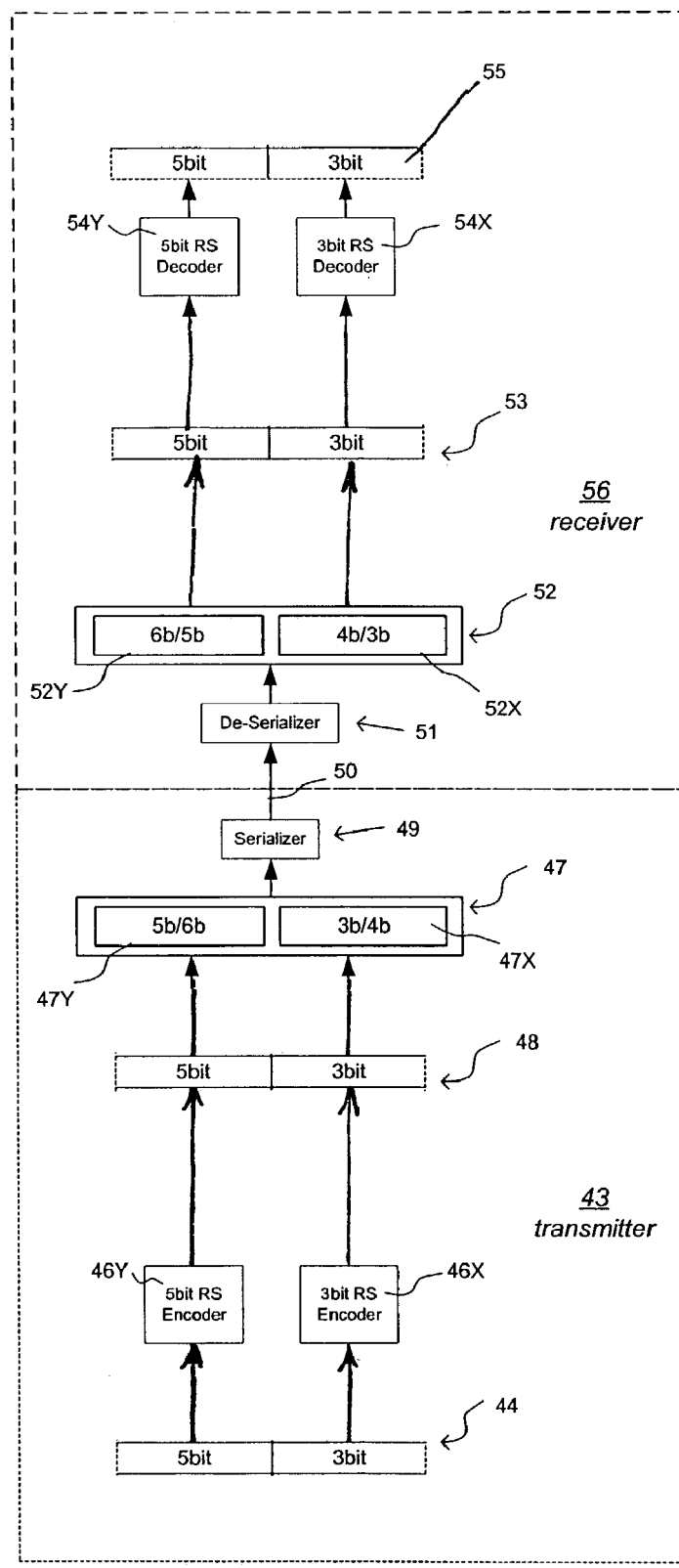
FIG. 4 illustrates, in a top-level diagram, embedding of Reed-Solomon encoding within 8B/10B encoding in one embodiment.

FIG. 4 illustrates circuitry in a data path through a transmitter as well as a receiver in one specific implementation. Specifically, user data (raw information) are received in the unit of bytes (8 bits). Each 8 bit byte is partitioned into a 3 bit symbol and a 5 bit symbol by appropriate wiring of the 8 wire bus carrying the 8 bit byte to RS encoders 46X and 46Y (FIG. 4). Specifically, data in the 3 bit channel is fed into a Galois Field 8 (GF8) Reed-Solomon encoder 46X (FIG. 4), and data in the 5 bit channel is fed into a Galois Field 32 (GF32) Reed-Solomon encoder 46Y (FIG. 4). In some embodiments, the data in each channel is fed to the respective encoder directly, without any buffering. Item 44 in FIG. 4 merely illustrates a logical view of the flow of data along the two channels, and not a physical register for buffering. Note that in other embodiments, registers may be used if necessary, as would be apparent to the skilled artisan.

The results of RS encoding are supplied directly to circuitry 47 of the type normally found in an 8B/10B encoder. Item 48 in FIG. 4 also merely illustrates a logical view of the flow of data along the two channels. Such data can have parity symbols of RS encoded data as illustrated in FIG. 4, depending on the value of the RS encoded 5 bits and RS encoded 3 bits. Note that the parity of RS coding are in units of symbol (wherein each symbol can be of multiple bits). Here as well, only one set of 5 bit and 3 bit encoded values are present on the wiring 48 between items 46X+46Y and item 47, because there is no physical register therebetween, although a register may be inserted in certain embodiments if necessary.

Circuitry 47 (FIG. 4) then further encodes the data that has been encoded by the Reed-Solomon Encoders. In FIG. 4, circuitry 47 is implemented as a combination of a 3B4B encoder 47X, and a 5B6B encoder 47Y. The data from the GF8 Reed-Solomon encoder 46X is fed into the 3B4B encoder 47X; the data from the GF32 Reed-Solomon encoder 46Y is fed into the 5B6B encoder 47Y. At this stage, the output data provided by circuitry 47 is DC balanced, and this data is then serialized and transferred to a receiver 56 (FIG. 4) by a serial link 50.

Receiver 56 reverses the above-described functions performed by transmitter 43. The received serial data is de-serialized into 10 bit sized units by a deserializer 51. The 10 bits of data are separated (by appropriate wiring) into a 6 bit part and a 4 bit part that correspond to the 5B/6B and the 3B/4B encoders in the 8B/10B encoder of the transmitter. A 10B/8B decoder 52 decodes the de-serialized data. The 10B/8B decoding is the reverse process of the 8B/10B encoding. Each 10 bits of data before 10B/8B decoding become 8 bits data after 10B/8B decoding.

The 8 bits of data consist of a 3 bit channel and a 5 bit channel that correspond to the partition of channels before Reed-Solomon encoders of the transmitter. A GF8 Reed-Solomon decoder 54X (FIG. 4) decodes the data in 3 bit channel and a GF32 Reed-Solomon decoder 54Y (FIG. 4) decodes the data in 5 bit channel. The decoded data is then re-constituted (by appropriate wiring) into 8 bit bytes, by combination of the decoded data from the 3 bit channel and the 5 bit channel.

In one particular embodiment in accordance with the invention, circuitry 47 (FIG. 4) for performing 5B/6B and 3B/4B encoding as well as circuitry 52 for performing 6B/5B and 4B/3B decoding is similar or identical to the corresponding circuitry described in U.S. Pat. No. 4,486,739 granted to Franaszek et al that was incorporated by reference above. However, prior to such line coding, in this particular embodiment, a 3 bit channel and a 5 bit channel of data (that are obtained after partitioning) are encoded in accordance with Reed-Solomon, as discussed below.

Reed-Solomon (RS) coding is a kind of non-binary coding that is used in some embodiments to implement data coding although other methods may be used in other embodiments. In RS coding, instead of encoding and decoding data bit by bit, RS coding encodes and decodes data in the units of symbols. Each symbol can be multiple bits (e.g. 3 bits, 5 bits etc). The Reed-Solomon coding constructs a symbol system based on Galois Field. The Reed-Solomon coding also needs a generator polynomial g(x). The parity symbols p(x) are calculated from the user data d(x) and the generator polynomial g(x). The parity symbols p(x) are then concatenated to the user data d(x) which becomes the coded data c(x). This coded data c(x) is sent to the receiver.

A receiver 56 (FIG. 4) receives the coded data r(x) which could be the same as coded data c(x) that was transmitted, if there is no error in the signal transfer; r(x) could also be different from c(x) if there are errors in the signal transfer. Receiver 56 uses r(x) and the generator polynomial g(x) to calculate the coding syndromes S(x). Then it uses S(x) to decide whether errors happened in the signal transfer. If errors happened in the signal transfer, receiver 56 calculates which symbols have error and the magnitudes of error in those symbols. With this information, the receiver 56 corrects one or more errors.

In order to achieve low latency and a small circuit in the Reed-Solomon coding, the Reed-Solomon encoder-decoder pairs are designed in one embodiment of the invention to correct just one symbol error. In this case, the generator polynomial g(x) is a second order polynomial:

$$g(x)=(x+\alpha^i)(x+\alpha^j) \quad i,j=1,2,\ldots i\neq j \quad (2.1)$$

$\alpha^i$ and $\alpha^j$ are symbols that will be described below. The encoder calculates the parity by the following equation.

$$p(x) = \mathrm{rem}\left\{\frac{d(x)\cdot x^2}{g(x)}\right\} \quad (2.2)$$

The parity p(x) concatenated to d(x) to get c(x) as in the following equation.

$$c(x)=d(x)\cdot x^2+p(x) \quad (2.3)$$

From equations (2.2) and (2.3), it can be shown that $\alpha^i$ and $\alpha^j$ are the roots of c(x):

$$c(x)=0 \text{ when } x=\alpha^i \text{ or } x=\alpha^j \quad (2.4)$$

Assume the errors happened in the signal transfer is e(x).

$$e(x)=e_0+e_1x+\ldots e_{n-1}x^{n-1} \quad (2.5)$$

where n is the length of the coded data c(x) in the unit of symbols.

Then, the receiver receives data r(x):

$$r(x)=c(x)+e(x) \quad (2.6)$$

The syndromes are calculated by substituting $x=\alpha^i$ and $\alpha^j$ into r(x). With equation (2.4) and (2.6), we get $$S_i=r(\alpha^i)=c(\alpha^i)+e(\alpha^i)=e(\alpha^i)$$

$$S_j=r(\alpha^j)=c(\alpha^j)+e(\alpha^j)=e(\alpha^j) \quad (2.7)$$

According to equations (2.5) and (2.7), if there is no error in the signal transfer, the syndromes should both be 0; if there is one error in the signal transfer, the syndromes become:

$$S_i=e\cdot(\alpha^i)^v$$

$$S_j=e\cdot(\alpha^j)^v \quad (2.8)$$

where e is the error magnitude and v is the error location.

To get a small circuit for the RS decoder, i is set to 0 and j can be an integer other than 0. For example, j=1 could be a choice. From equation (2.8), this gives:

$$S_0=e\cdot(\alpha^0)^v=e$$

$$S_1=e\cdot(\alpha^1)^v=e\cdot\alpha^v \quad (2.9)$$

So, the error magnitude e is derived directly from $S_0$ and the error position v can be derived from $S_0$ and $S_1$. After solving equation (2.9), the error correction can be done as discussed elsewhere herein.

The construction of Galois Field, the implementation of the Reed-Solomon encoder and decoder are described in detail next. The first step in Reed-Solomon coding is to construct the symbol system—finite field. Reed-Solomon coding uses Galois Field (GF) in a manner that will be apparent to the skilled artisan in view of this disclosure.

Depending on the embodiment, a primitive binary polynomial may be chosen by the skilled artisan, to construct such a Galois Field. For GF8 (3 bit per symbol), the primitive polynomials can be selected to be either 1101 or 1011. Both of them work well in this design. In this document, the primitive 1011 is chosen for GF8 to show an example. For GF32 (5 bit per symbol), there are six primitive polynomials for choice. They are 101001, 100101, 111101, 111011, 110111 and 101111. All of them work well in this design.

In this document, the primitive 100101 is chosen for GF32 to show an example. The other primitive polynomials can be used without affecting the design. The detail of constructing Galois Field with primitive polynomials can be found in a number of prior art references, including, for example, Shu Lin, D. J. Costello Jr. Error Control Coding: Fundamentals and Applications, pp 29–33, 1983, Prentice-Hall that was incorporated by reference above.

The Galois Fields of GF8 and GF32 are as illustrated below. The GF8 symbols generated by primitive 1011 are listed in Table 1. Moreover, the GF32 symbols generated by primitive 100101 are listed in Table 2.

TABLE 1

The GF8 finite field with primitive 1011

| Symbol | Binary |
|---|---|
| 0 | 000 |
| $\alpha^0$ | 001 |
| $\alpha^1$ | 010 |
| $\alpha^2$ | 100 |
| $\alpha^3$ | 011 |
| $\alpha^4$ | 110 |
| $\alpha^5$ | 111 |
| $\alpha^6$ | 101 |

TABLE 2

The GF32 finite field with primitive 100101

| Symbol | Binary |
|---|---|
| 0 | 00000 |
| $\alpha^0$ | 00001 |
| $\alpha^1$ | 00010 |
| $\alpha^2$ | 00100 |
| $\alpha^3$ | 01000 |
| $\alpha^4$ | 10000 |
| $\alpha^5$ | 00101 |
| $\alpha^6$ | 01010 |
| $\alpha^7$ | 10100 |
| $\alpha^8$ | 01101 |
| $\alpha^9$ | 11010 |
| $\alpha^{10}$ | 10001 |
| $\alpha^{11}$ | 00111 |
| $\alpha^{12}$ | 01110 |
| $\alpha^{13}$ | 11100 |
| $\alpha^{14}$ | 11101 |
| $\alpha^{15}$ | 11111 |
| $\alpha^{16}$ | 11011 |
| $\alpha^{17}$ | 10011 |
| $\alpha^{18}$ | 00011 |
| $\alpha^{19}$ | 00110 |
| $\alpha^{20}$ | 01100 |
| $\alpha^{21}$ | 11000 |
| $\alpha^{22}$ | 10101 |
| $\alpha^{23}$ | 01111 |
| $\alpha^{24}$ | 11110 |
| $\alpha^{25}$ | 11001 |

TABLE 2-continued

The GF32 finite field with primitive 100101

| Symbol | Binary |
|---|---|
| $\alpha^{26}$ | 10111 |
| $\alpha^{27}$ | 01011 |
| $\alpha^{28}$ | 10110 |
| $\alpha^{29}$ | 01001 |
| $\alpha^{30}$ | 10010 |

For GF8 (3 bit per symbol), because the maximum location that the Reed-Solomon decoder can tell is 6, the coded data c(x) in the 3 bit channel can be 7 symbols at the most (v=0,1,2 . . . 6). For the same reason, the coded data c(x) in the 5 bit channel can be 31 symbols at the most. As an example, this disclosure illustrates a design to encode and decode 5 symbols user data in both GF8 and GF32. The user data of other lengths can be coded using the same algorithm in the manner described herein.

When the coded data c(x) is shorter than the maximum length stated here (7 symbols in GF8 and 31 symbols in GF32), the Reed-Solomon coding can correct a single symbol error and it also can detect some multiple errors. This is because some points in the error state space are not used, some multiple errors can lead the received data r(x) into the unused error state space and then be detected by the Reed-Solomon decoder.

In this design, when integrated with 8B10B coding, the GF8 RS coding and the GF32 RS coding are independent of each other.

The Reed-Solomon encoder calculates:

$$p(x) = \text{rem}\left\{\frac{d(x) \cdot x^2}{g(x)}\right\}$$

and append the parity symbols p(x) to the end of the original user data d(x). g(x) is the generator polynomial chose by the designer. As described previously, to get a small Reed-Solomon decoder, the generator polynomial should be chosen as:

$$g(x)=(x+\alpha^0)(x+\alpha^j)\ j=1,2,\ldots$$

As an example, one may choose j=1.

For GF8 in Table 1, this gives $g(x)=x^2+\alpha^3 x+\alpha$.

For GF32 in Table 2, this gives $g(x)=x^2+\alpha^{18} x+\alpha$.

Figure 5:
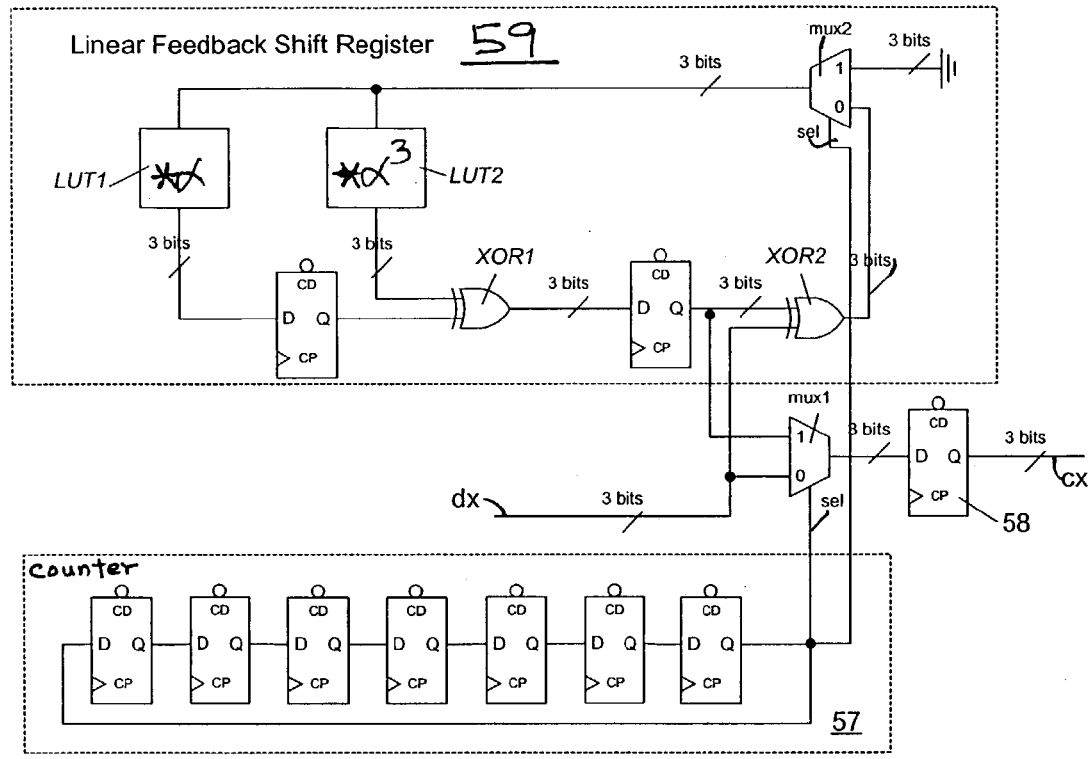
FIG. 5 illustrates, in a schematic diagram, circuitry for a GF8 (3 bit/symbol channel) Reed-Solomon (RS) encoder.

A GF8 (3 bit/symbol channel) Reed-Solomon (RS) encoder is illustrated in FIG. 5. In FIG. 5, the signal dx is the 3 bits wide portion of user data before Reed-Solomon encoding, and the signal cx is the 3 bit wide Reed-Solomon encoded data. A signal clk is a digital clock that drives the encoder. The encoder contains a counter 57 (formed by seven flip-flops connected in series, with the output of the last flip-flop connected to the input of the first flip-flop) that provides a select signal to each of two multiplexers "mux1" and "mux2". Specifically, in the example illustrated in FIG. 5, when the pin 'sel' of a mux is '0', the output of the mux equal to the input from pin '0'; when the pin 'sel' of a mux is '1', the output of the mux equal to the input from pin '1'

Multiplexer "mux1" has one input port (that is 3 bits wide) coupled to the wires carrying the incoming 3 bits of user data (labeled "dx"), and another input port coupled to an output bus of a linear feedback shift register 59 that includes the above-described multiplexer "mux2." Linear feedback shift register 59 performs finite field division as would be apparent to the skilled artisan. Therefore, any circuitry can be used to implement linear feedback shift register 59, although one specific example is illustrated in the dotted box in FIG. 5 and is described next.

Specifically, multiplexer mux2 in some embodiments of linear feedback shift register 59 has an input port (that is 3 bits wide) coupled to ground to provide the logic value 0. Multiplexer "mux2" of these embodiments has another input port (that is also 3 bits wide) coupled to receive the output of an exclusive OR gate XOR2 (that generates a 3 bit output from two inputs: the user data (labeled "dx") and the output of a flip-flop FF2.

Flip-flop FF2 also generates the output of linear feedback shift register 59, and is therefore coupled to an input port of multiplexer "mux1" as noted above. The output from multiplexer "mux1" is latched in a flip-flop 58 that in turn provides the RS-encoded intermediate result (labeled "cx") that is to be further encoded, by a 3B/4B encoder normally used in 8B/10B line coding.

Referring back to linear feedback shift register 59, multiplexer "mux2" operates under the control of counter 57 to supply one of its two inputs (either zero or the output from XOR2) to the input port of each of two lookup tables LUT1 and LUT2. Tables LUT1 and LUT2 contain values as discussed elsewhere herein. A 3 bit output of table LUT1 is provided to a flip-flop FF1 that in turn provides its output to an exclusive OR gate XOR1. Gate XOR1 also receives an input from the other table LUT2 and provides its output to the above-described flip-flop FF2.

Counter 57 controls the selection of the multiplexers "mux1" and "mux2". When reset, the registers in the counter 57 are initialized to the value "1100000" from left to right in FIG. 5 if the original user data is 5 symbols. The just-described bit pattern loaded in counter 57 enables mux1 to select (as appropriate) either the user data or the parity symbols from LFSR as the output. The symbols in the user data dx are fed to the encoder one symbol per clock. Two clocks after the last symbol of the user data dx is fed to the encoder, the encoded results cx are shifted out from the encoder completely. A pass of RS-encoding is completed.

Counter 57 in the first five clocks T0–T4 outputs the value 0 and hence mux1 will choose dx input as its output to cx (and hence the original user data of 15 bits is supplied with no change). Following this, at times T5 and T6, counter 57 generates the value 1 and hence mux1 selects the signal from LFSR 59 as its output. This output is the calculated parity 1 and parity 0 symbols (each of 3 bits, for a total of 6 parity bits). Flipflop 58 synchornizes the output of mux 1 to the system clock, and it introduces one clock delay. So the RS encoder in FIG. 5 receives a dx signal of 5 symbols (3 bits each) and generates a coded signal cx of 7 symbols (3 bits each).

In this embodiment, counter 57 has another purpose. Counter 57 also controls mux2 which controls the input in LFSR 59. In the first five clocks T0–T4, the original user data d0–d4 (FIG. 6) is shifted into LFSR 59 and at times T5 and T6, the select signal becomes 1, and mux2 shifts in two 3 bit zero values (from ground). The shifting in of user data and followed by two zero values causes LFSR 59 to generate two parity symbols.

The lookup table LUT1 in FIG. 5 which forms a portion of the LFSR does multiplication (*α) and it is illustrated in Table 3.

TABLE 3

The Lookup Table for doing multiplication (*α) in GF(8)

| Input | Output |
|-------|--------|
| 000 | 000 |
| 001 | 010 |
| 010 | 100 |
| 100 | 011 |
| 011 | 110 |
| 110 | 111 |
| 111 | 101 |
| 101 | 001 |

Another lookup table LUT2 does multiplication (*α$^3$) and it is in Table 4.

TABLE 4

The Lookup Table for doing multiplication (*α$^3$) in GF(8)

| input | Output |
|-------|--------|
| 000 | 000 |
| 001 | 011 |
| 010 | 110 |
| 100 | 111 |
| 011 | 101 |
| 110 | 001 |
| 111 | 010 |
| 101 | 100 |

The LUTs can be implemented in combinational logic blocks or in memories. A timing diagram of the above-described GF8 Reed-Solomon encoder is illustrated in FIG. 6.

Figure 6:
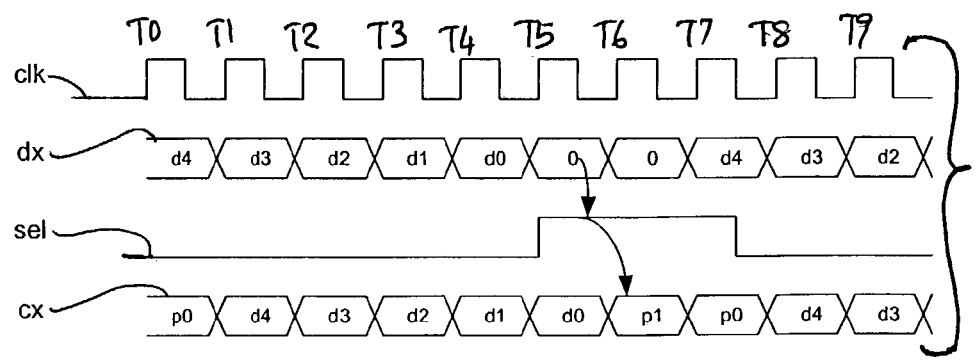
FIG. 6 illustrates, in a timing diagram, behavior of the GF8 Reed-Solomon encoder illustrated in FIG. 5.

As illustrated in FIG. 6, by setting 'sel' to value 0, a number of data blocks d0, d1, d2, d3 and d4 are received at times T4, T3, T2, T1, T0 respectively. At time T5 and T6, the signal 'sel' is changed to the value '1' which causes mux2 choose value 0 to shift into the Linear Feedback Shift Register, the 'sel' of value '1' also causes mux1 to choose the output from the Linear Feedback Shift Register which is the parity symbols of the coded word. Because flipflop 58 in FIG. 5 synchronizes the output signal cx with the clock, it causes 1 clock delay in the signal cx. Therefore, between T1 and T7, the user data d4, d3, d2, d1, d0 and the parity symbols p1, p0 output from signal cx which complete a pass of RS encoding.

Figure 7:
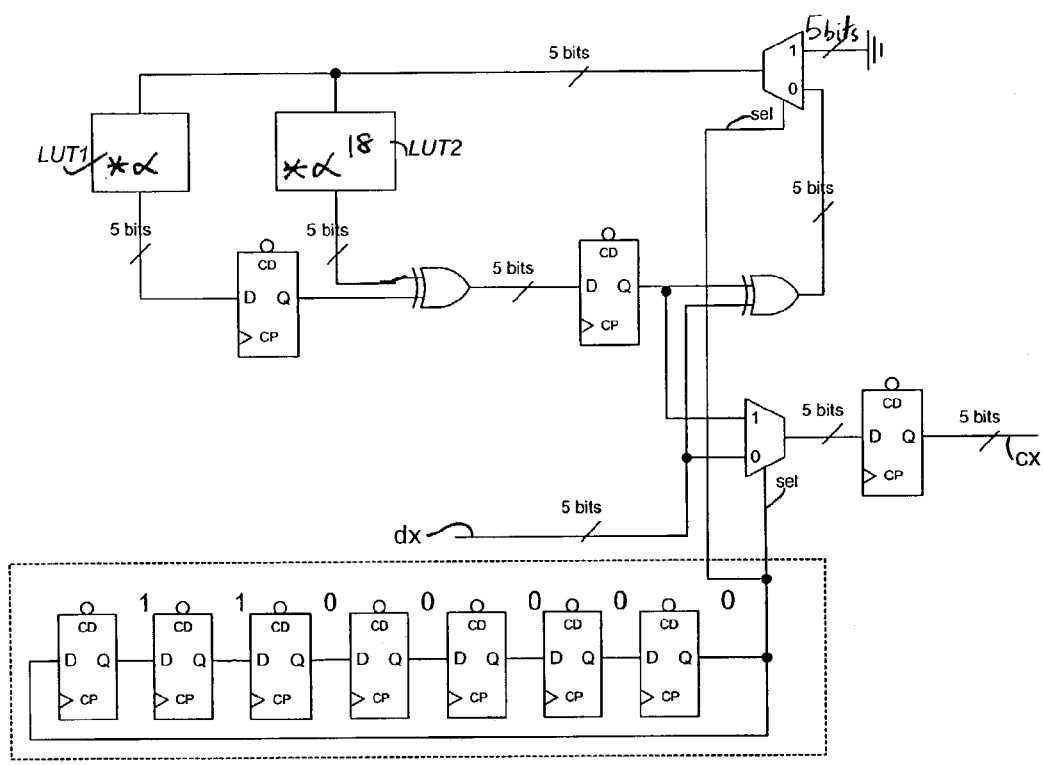
FIG. 7 illustrates, in a schematic diagram, circuitry for a GF32 (5 bit/symbol channel) Reed-Solomon encoder.

The GF32 RS encoder has the same structure as the GF8 RS encoder except that it has 5 bit data width and different LUTs. The schematic of GF32 RS encoder is shown in FIG. 7. FIG. 7 is not further described because all elements in FIG. 7 are similar to FIG. 5 except for the difference in width. In FIG. 7, lookup table LUT1 does multiplication (*α) and it is listed in Table 5.

TABLE 5

The Lookup Table for doing multiplication (*α) in GF(32)

| input | Output |
|-------|--------|
| 00000 | 00000 |
| 00001 | 00010 |
| 00010 | 00100 |
| 00100 | 01000 |

TABLE 5-continued

The Lookup Table for doing multiplication (*α) in GF(32)

| input | Output |
|---|---|
| 01000 | 10000 |
| 10000 | 00101 |
| 00101 | 01010 |
| 01010 | 10100 |
| 10100 | 01101 |
| 01101 | 11010 |
| 11010 | 10001 |
| 10001 | 00111 |
| 00111 | 01110 |
| 01110 | 11100 |
| 11100 | 11101 |
| 11101 | 11111 |
| 11111 | 11011 |
| 11011 | 10011 |
| 10011 | 00011 |
| 00011 | 00110 |
| 00110 | 01100 |
| 01100 | 11000 |
| 11000 | 10101 |
| 10101 | 01111 |
| 01111 | 11110 |
| 11110 | 11001 |
| 11001 | 10111 |
| 10111 | 01011 |
| 01011 | 10110 |
| 10110 | 01001 |
| 01001 | 10010 |
| 10010 | 00001 |

The lookup table LUT2 does multiplication (*α$^{18}$) and it is in Table 6.

TABLE 6

The Lookup Table for doing multiplication (*α$^{18}$) in GF(32)

| input | Output |
|---|---|
| 00000 | 00000 |
| 00001 | 00011 |
| 00010 | 00110 |
| 00100 | 01100 |
| 01000 | 11000 |
| 10000 | 10101 |
| 00101 | 01111 |
| 01010 | 11110 |
| 10100 | 11001 |
| 01101 | 10111 |
| 11010 | 01011 |
| 10001 | 10110 |
| 00111 | 01001 |
| 01110 | 10010 |
| 11100 | 00001 |
| 11101 | 00010 |
| 11111 | 00100 |
| 11011 | 01000 |
| 10011 | 10000 |
| 00011 | 00101 |
| 00110 | 01010 |
| 01100 | 10100 |
| 11000 | 01101 |
| 10101 | 11010 |
| 01111 | 10001 |
| 11110 | 00111 |
| 11001 | 01110 |
| 10111 | 11100 |
| 01011 | 11101 |
| 10110 | 11111 |
| 01001 | 11011 |
| 10010 | 10011 |

The LUT can be implemented in combinational logic blocks or in memories. The timing diagram of the GF32 RS encoder is the same as that of the GF8 RS encoder.

Figure 8A:
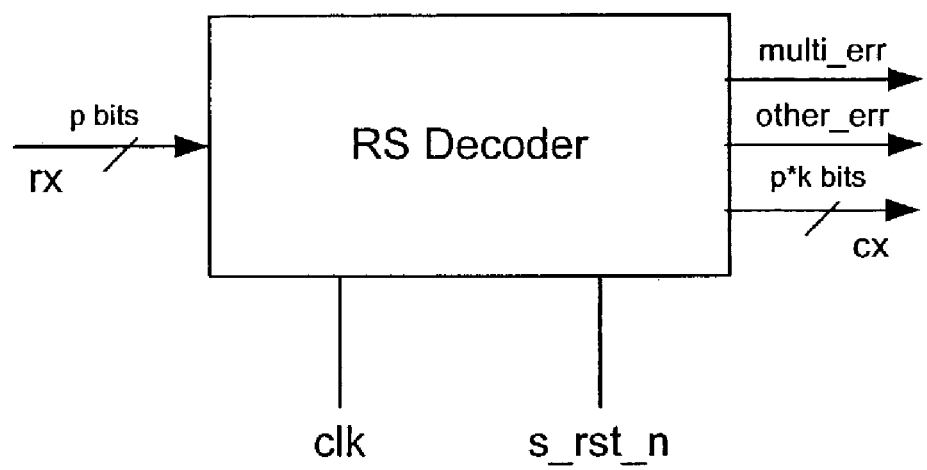
FIGS. 8A and 8B illustrate in a high level block diagram and an intermediate level block diagram respectively, a Reed-Solomon decoder for 1 symbol error correction used in some embodiments.
Figure 8B:
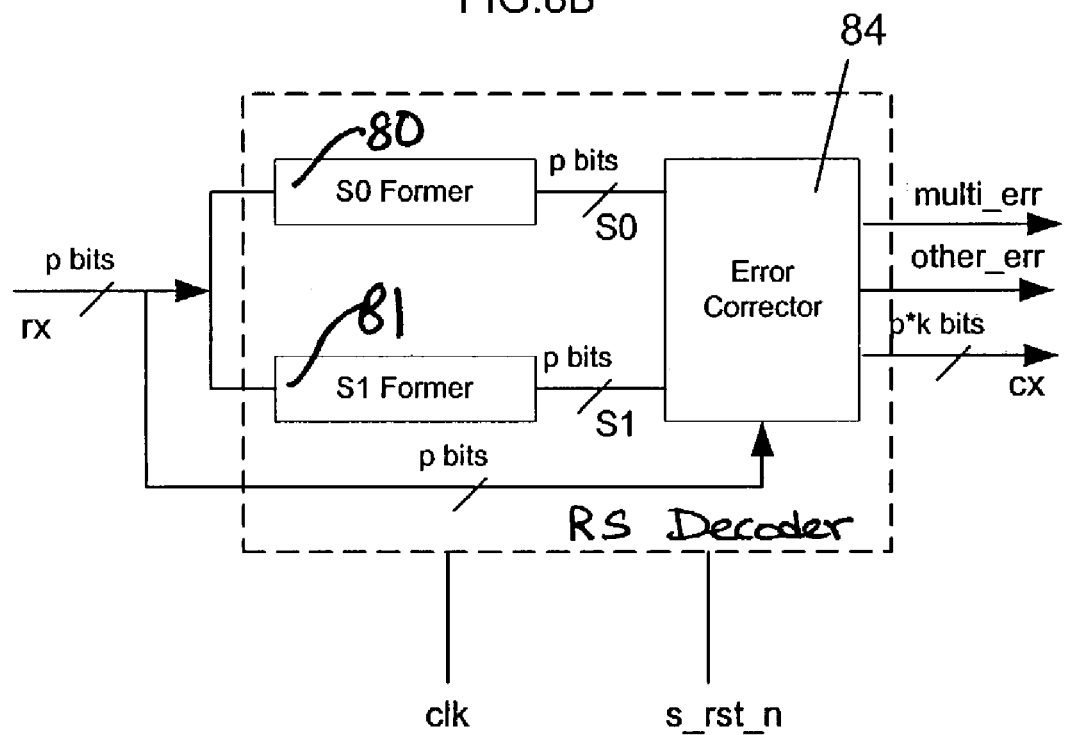

As shown in FIGS. 8A and 8B the Reed-Solomon decoders receive the encoded data in symbols and calculate two syndromes $S_0$ and $S_1$. An error corrector 84 calculates the error magnitude and error location from $S_0$ and $S_1$ based on equation (2.9), error corrector 84 corrects the error if the error is in the user data, it also indicates that error happened if the error is in the parity symbols.

To save the size of the circuits in this design, if there is one error and the error is located in the user data, the error is corrected; else if the error is located in the parity symbols, the output signal other_err indicates that an error happened in the parity symbols without correcting it. The output signal multi_err indicates whether the transfer has multi-symbol errors that are uncorrectable. Because the generator polynomial is $g(x)=(x+\alpha^0)(x+\alpha^1)$ in the coding, the error magnitude is $S_0$ and the error location can be derived from the two syndromes $S_0$ and $S_1$.

Figure 9:
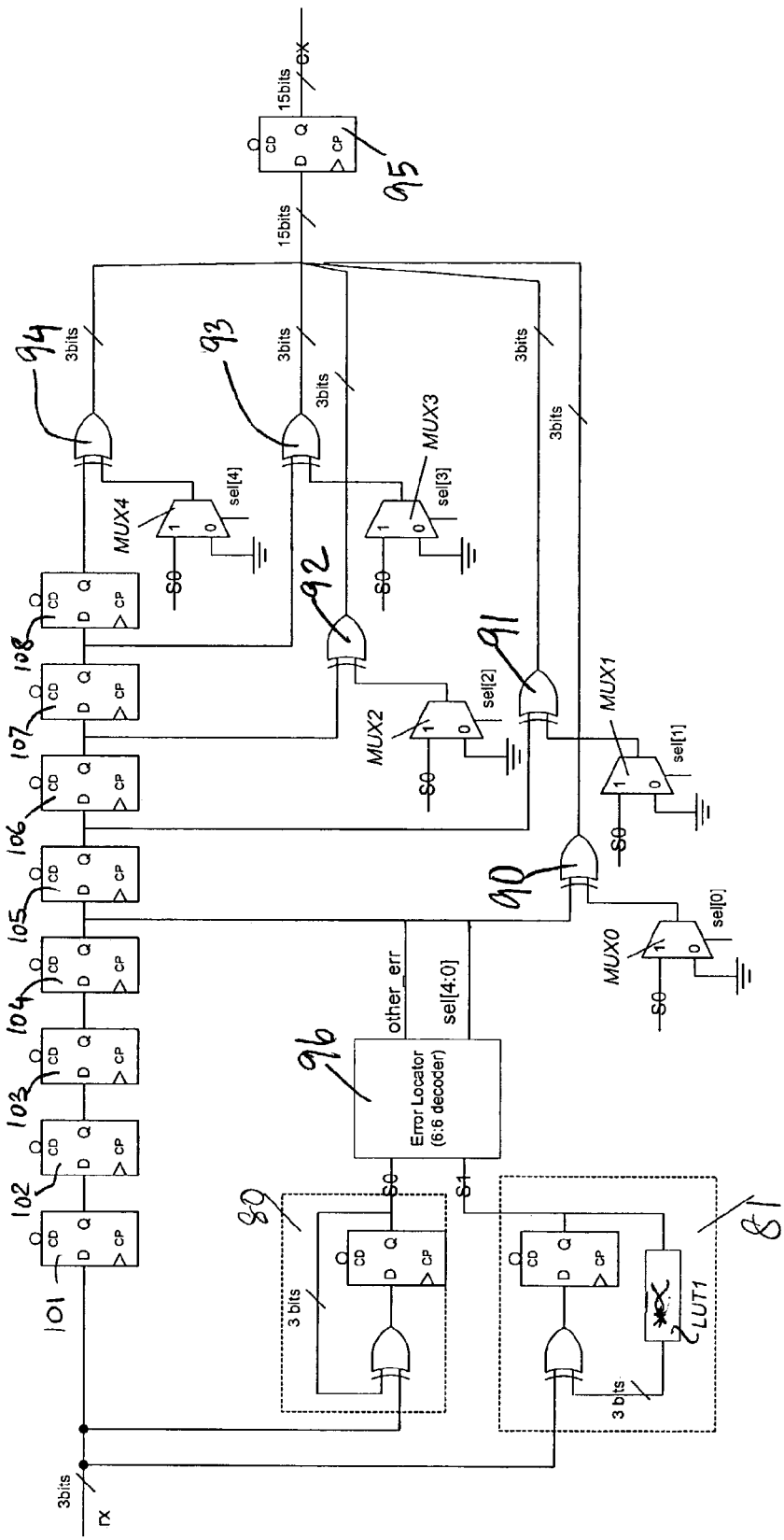
FIG. 9 illustrates, in a schematic diagram, a GF8 RS decoder of the type illustrated in FIGS. 8A and 8B.

FIG. 9 shows the GF8 RS decoder of one embodiment. One embodiment of error corrector 84 of FIG. 8B is implemented, as illustrated in FIG. 9, by an error locator 96, five multiplexers MUX0–MUX4, five exclusive OR gates 90–94, and eight flip-flops 101–108. A lookup table LUT1 in FIG. 9 does multiplication (*α) in GF8 and it is listed in Table 3. In this embodiment, it is the same as the LUT1 used in GF8 encoder. LUT1 can be implemented in combinational logic or in memory.

In one example, the user data before the Reed-Solomon encoding is 5 symbols (15 bits), and the error locator 96 in FIG. 9 is a 6in-6out encoder. The 6 bit inputs to error locator 96 are $S_0$ and $S_1$. The error locator 96 uses 5 of the 6 outputs in signal sel to flag the error location in the user data in a one-hot encoding fashion. The output signal other_err indicates whether the error is in the parity symbols. The truth table of the error locator 96 is in Table 7, which is listed below.

As shown in the FIG. 9, the signal rx is the data (7 symbols d4,d3,d2,d1,d0,p1,p0 that are sent by the encoder of the type illustrated in FIG. 5) received (one clock at a time) by the Reed-Solomon decoder, and in this embodiment it is 3 bit wide. The received data rx are fed to syndrome formers 80 and 81 (see in FIGS. 8 and 9). After all the symbols of the signal rx received by the syndrome formers, the syndromes $S_0$ and $S_1$ are generated as outputs of the syndrome formers 80 and 81.

Figure 10:
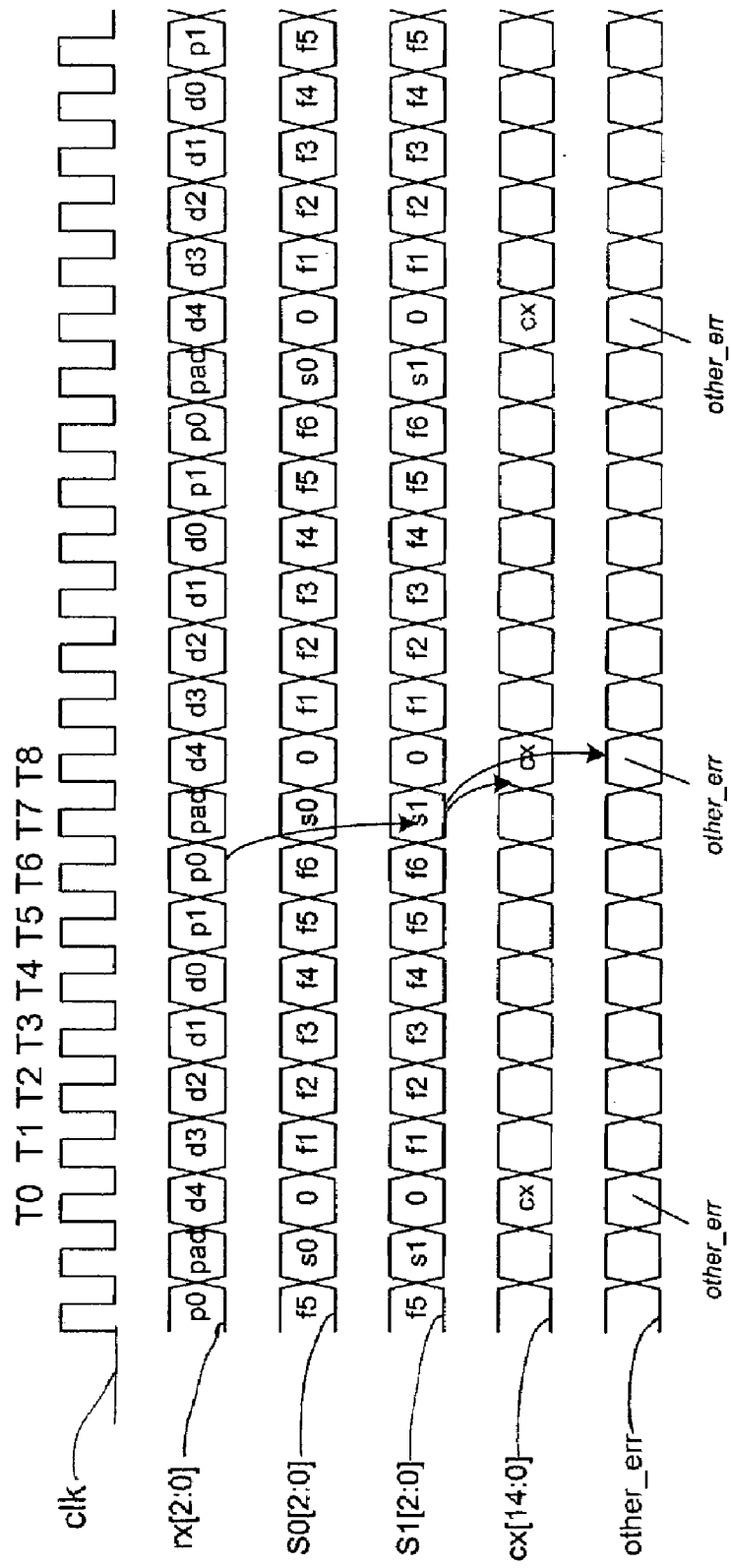
FIG. 10 illustrates, in a timing diagram, behavior of the GF8 RS decoder of FIG. 9.

Specifically, after p0 is shifted in, in the next clock cycle at time T7 (see FIG. 10), the syndrome formers 80 and 81 generate the syndromes $S_0$ and $S_1$ which are 3 bit signals (labeled S0[2:0] and S1 [2:0] in FIG. 10). At time T7, the exclusive OR gate 94 has as one input d4 and the other input from MUX4. In a similar manner, at the same time, the exclusive OR gate 93 has as one input d3 and the other input from MUX3. The same type of relation holds for gates 92, 91 and 90 relative to MUX2, MUX1 and MUX0.

Each bit in the signal 'sel' that is generated by error locator 96 corresponds to one symbol in the user data before the RS encoding. Error locator 96 is implemented as a 6:6 decoder. If a bit in the signal 'sel' is in the value of 1, it means the corresponded symbol in the encoded signal rx has an error. The signal 'other_err' is used to indicate error which is not in the user data. If signal 'other_err' is in the value of 1, then parity symbol p0 or p1 has an error.

Specifically, if there is an error in d4, then the error locator causes signal sel[4:0] of five bits, to have a value of 1 in its 5th bit (assuming the bits are numbered 0–4), which is sel[4]

(because the locator is one-hot decoder). Therefore, when signal sel[4] has value 1, MUX4 chooses the syndrome so (which is the error magnitude) as its output. Therefore, the error magnitude is XORed with d4, and therefore the correct symbol for d4 is recovered. The same operation happens with the other XOR gates. Flipflop 95 is used for synchronizing to the system clock, and introduces one clock delay, and at time T8, we get corrected symbols as output cx.

To summarize, the one-hot "sel" signal from the Error Locator 96 and the MUX0, MUX1, . . . MUX4 direct the error magnitude S0 to the error symbol in the user data, and the XOR gates 90–94 invert the erroneous bits to correct the errors. The output cx of the flip-flop 95 in the RS decoder illustrated in FIG. 9 is the user data whose error had been corrected if the errors are single symbol error in the user data.

TABLE 7

The Truth Table to do one-hot locate of the error location in GF8 RS decoder

| S1 | S0 | Sel [4:0] | Other_err |
|---|---|---|---|
| 000 | 000 | 00000 | 0 |
| 001 | 001 | 00000 | 1 |
| 001 | 101 | 00000 | 1 |
| 001 | 111 | 00001 | 0 |
| 001 | 110 | 00010 | 0 |
| 001 | 011 | 00100 | 0 |
| 001 | 100 | 01000 | 0 |
| 001 | 010 | 10000 | 0 |
| 010 | 010 | 00000 | 1 |
| 010 | 001 | 00000 | 1 |
| 010 | 101 | 00001 | 0 |
| 010 | 111 | 00010 | 0 |
| 010 | 110 | 00100 | 0 |
| 010 | 011 | 01000 | 0 |
| 010 | 100 | 10000 | 0 |
| 100 | 100 | 00000 | 1 |
| 100 | 010 | 00000 | 1 |
| 100 | 001 | 00001 | 0 |
| 100 | 101 | 00010 | 0 |
| 100 | 111 | 00100 | 0 |
| 100 | 110 | 01000 | 0 |
| 100 | 011 | 10000 | 0 |
| 011 | 011 | 00000 | 1 |
| 011 | 100 | 00000 | 1 |
| 011 | 010 | 00001 | 0 |
| 011 | 001 | 00010 | 0 |
| 011 | 101 | 00100 | 0 |
| 011 | 111 | 01000 | 0 |
| 011 | 110 | 10000 | 0 |
| 110 | 110 | 00000 | 1 |
| 110 | 011 | 00000 | 1 |
| 110 | 100 | 00001 | 0 |
| 110 | 010 | 00010 | 0 |
| 110 | 001 | 00100 | 0 |
| 110 | 101 | 01000 | 0 |
| 110 | 111 | 10000 | 0 |
| 111 | 111 | 00000 | 1 |
| 111 | 110 | 00000 | 1 |
| 111 | 011 | 00001 | 0 |
| 111 | 100 | 00010 | 0 |
| 111 | 010 | 00100 | 0 |
| 111 | 001 | 01000 | 0 |
| 111 | 101 | 10000 | 0 |
| 101 | 101 | 00000 | 1 |
| 101 | 111 | 00000 | 1 |
| 101 | 110 | 00001 | 0 |
| 101 | 011 | 00010 | 0 |
| 101 | 100 | 00100 | 0 |
| 101 | 010 | 01000 | 0 |
| 101 | 001 | 10000 | 0 |
| other | Other | 00000 | 0 |

The error locator in FIG. 9 can be implemented in combinational logic or in memory.

The timing diagram of the GF8 RS decoder is in FIG. 10. As illustrated in FIG. 10, the Reed-Solomon decoder receives symbols correspond to d4, d3, d2, d1, d0, p1, p0 on rx during the time T0, T1, . . . T6. After the data symbols are received, at time T7, the syndrome formers output the syndromes S0 and S1. An error locator in FIG. 8 uses S0 and S1 to calculate the error location. If there are errors in the user data part of the received signal, the error symbol is corrected as illustrated in FIG. 8. The error free data d4, d3, d2, d1, d0 are presented on cx at time T8. At time T8, the signal other_err indicates whether the one symbol error is in parity symbols p1 or p0.

The GF32 RS decoder has the same structure as the GF8 RS decoder except that it has 5 bit data width, the different LUT1 and the different Error Locator. The schematic of GF32 RS decoder is in FIG. 11.

Figure 11:
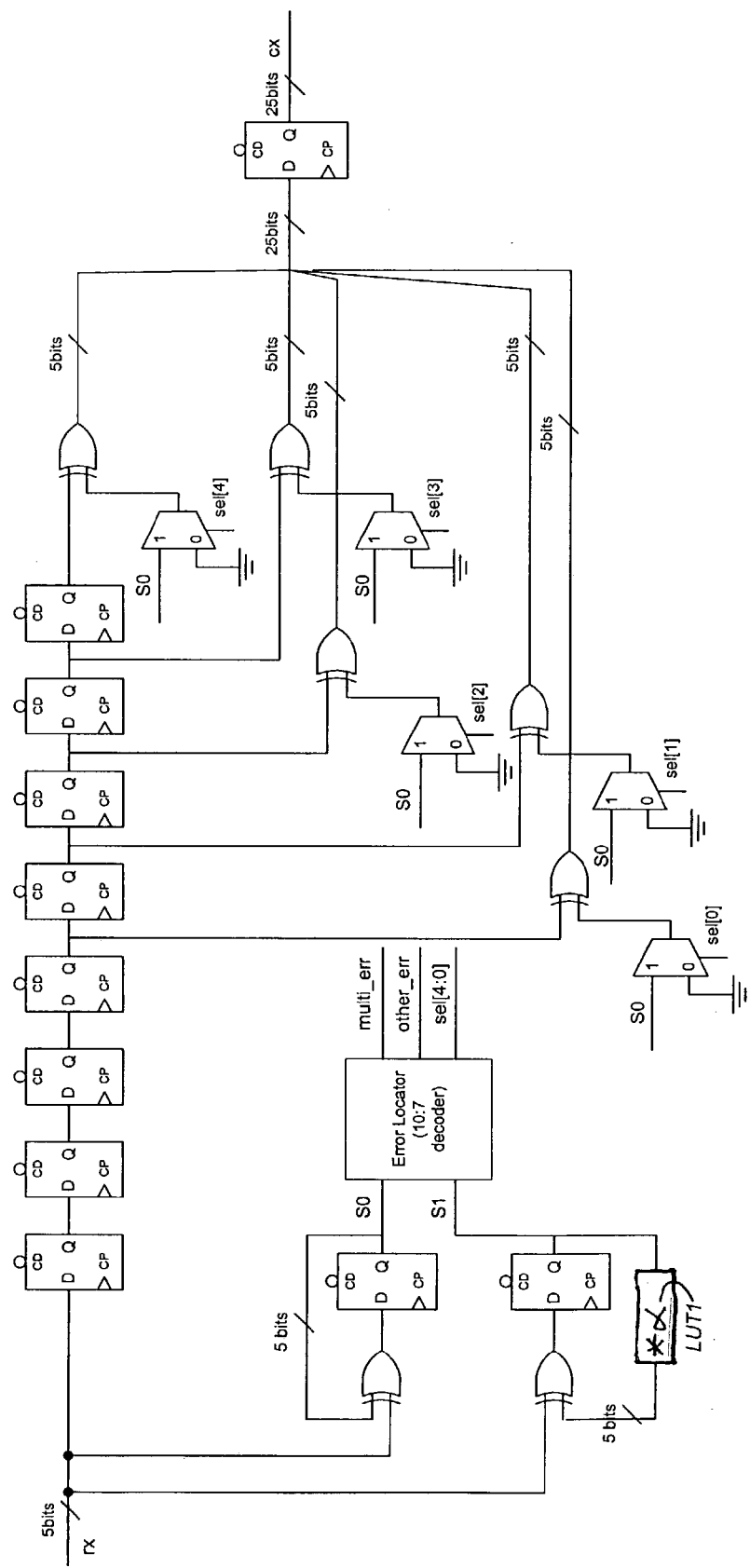
FIG. 11 illustrates, in a schematic diagram, a GF32 RS decoder used in one embodiment.

The lookup table LUT1 in FIG. 11 does multiplication (*α) in GF32 and it is in Table 5. It is the same as the LUT1 used in GF32 encoder. LUT1 can be implemented in combinational logic or in memory. If the user data before Reed-Solomon encoding is 5 symbols (25 bits), the Error Locator in FIG. 11 is a 10in-7out encoder. The 10 bit inputs are $S_0$ and $S_1$. The error locator uses 5 of the 7 outputs in signal sel to flag the error location in the user data in a one-hot encoding fashion. The output other_err indicates whether the error is in the parity symbols that do not need to be corrected. The output multi_err indicates whether the transfer has multi-symbol errors that are uncorrectable. The truth table of the error locator is in Table 8. The error locator in FIG. 11 can be implemented in combinational logic or memory.

TABLE 8

The Truth Table to do one-hot locate of the error location in GF32 RS decoder

| S1 | S0 | Sel | Other_err | Multi_err |
|---|---|---|---|---|
| 00000 | 00000 | 00000 | 0 | 0 |
| 00001 | 00001 | 00000 | 1 | 0 |
| 00001 | 10010 | 00000 | 1 | 0 |
| 00001 | 01001 | 00001 | 0 | 0 |
| 00001 | 10110 | 00010 | 0 | 0 |
| 00001 | 01011 | 00100 | 0 | 0 |
| 00001 | 10111 | 01000 | 0 | 0 |
| 00001 | 11001 | 10000 | 0 | 0 |
| 00001 | others | 00000 | 0 | 1 |
| 00010 | 00010 | 00000 | 1 | 0 |
| 00010 | 00001 | 00000 | 1 | 0 |
| 00010 | 10010 | 00001 | 0 | 0 |
| 00010 | 01001 | 00010 | 0 | 0 |
| 00010 | 10110 | 00100 | 0 | 0 |
| 00010 | 01011 | 01000 | 0 | 0 |
| 00010 | 10111 | 10000 | 0 | 0 |
| 00010 | others | 00000 | 0 | 1 |
| 00100 | 00100 | 00000 | 1 | 0 |
| 00100 | 00010 | 00000 | 1 | 0 |
| 00100 | 00001 | 00001 | 0 | 0 |
| 00100 | 10010 | 00010 | 0 | 0 |
| 00100 | 01001 | 00100 | 0 | 0 |
| 00100 | 10110 | 01000 | 0 | 0 |
| 00100 | 01011 | 10000 | 0 | 0 |
| 00100 | others | 00000 | 0 | 1 |
| 01000 | 01000 | 00000 | 1 | 0 |
| 01000 | 00100 | 00000 | 1 | 0 |
| 01000 | 00010 | 00001 | 0 | 0 |
| 01000 | 00001 | 00010 | 0 | 0 |
| 01000 | 10010 | 00100 | 0 | 0 |
| 01000 | 01001 | 01000 | 0 | 0 |

TABLE 8-continued

The Truth Table to do one-hot locate of the error location in GF32 RS decoder

| S1 | S0 | Sel | Other_err | Multi_err |
|---|---|---|---|---|
| 01000 | 10110 | 10000 | 0 | 0 |
| 01000 | others | 00000 | 0 | 1 |
| 10000 | 10000 | 00000 | 1 | 0 |
| 10000 | 01000 | 00000 | 1 | 0 |
| 10000 | 00100 | 00001 | 0 | 0 |
| 10000 | 00010 | 00010 | 0 | 0 |
| 10000 | 00001 | 00100 | 0 | 0 |
| 10000 | 10010 | 01000 | 0 | 0 |
| 10000 | 01001 | 10000 | 0 | 0 |
| 10000 | others | 00000 | 0 | 1 |
| 00101 | 00101 | 00000 | 1 | 0 |
| 00101 | 10000 | 00000 | 1 | 0 |
| 00101 | 01000 | 00001 | 0 | 0 |
| 00101 | 00100 | 00010 | 0 | 0 |
| 00101 | 00010 | 00100 | 0 | 0 |
| 00101 | 00001 | 01000 | 0 | 0 |
| 00101 | 10010 | 10000 | 0 | 0 |
| 00101 | others | 00000 | 0 | 1 |
| 01010 | 01010 | 00000 | 1 | 0 |
| 01010 | 00101 | 00000 | 1 | 0 |
| 01010 | 10000 | 00001 | 0 | 0 |
| 01010 | 01000 | 00010 | 0 | 0 |
| 01010 | 00100 | 00100 | 0 | 0 |
| 01010 | 00010 | 01000 | 0 | 0 |
| 01010 | 00001 | 10000 | 0 | 0 |
| 01010 | others | 00000 | 0 | 1 |
| 10100 | 10100 | 00000 | 1 | 0 |
| 10100 | 01010 | 00000 | 1 | 0 |
| 10100 | 00101 | 00001 | 0 | 0 |
| 10100 | 10000 | 00010 | 0 | 0 |
| 10100 | 01000 | 00100 | 0 | 0 |
| 10100 | 00100 | 01000 | 0 | 0 |
| 10100 | 00010 | 10000 | 0 | 0 |
| 10100 | others | 00000 | 0 | 1 |
| 01101 | 01101 | 00000 | 1 | 0 |
| 01101 | 10100 | 00000 | 1 | 0 |
| 01101 | 01010 | 00001 | 0 | 0 |
| 01101 | 00101 | 00010 | 0 | 0 |
| 01101 | 10000 | 00100 | 0 | 0 |
| 01101 | 01000 | 01000 | 0 | 0 |
| 01101 | 00100 | 10000 | 0 | 0 |
| 01101 | others | 00000 | 0 | 1 |
| 11010 | 11010 | 00000 | 1 | 0 |
| 11010 | 01101 | 00000 | 1 | 0 |
| 11010 | 10100 | 00001 | 0 | 0 |
| 11010 | 01010 | 00010 | 0 | 0 |
| 11010 | 00101 | 00100 | 0 | 0 |
| 11010 | 10000 | 01000 | 0 | 0 |
| 11010 | 01000 | 10000 | 0 | 0 |
| 11010 | others | 00000 | 0 | 1 |
| 10001 | 10001 | 00000 | 1 | 0 |
| 10001 | 11010 | 00000 | 1 | 0 |
| 10001 | 01101 | 00001 | 0 | 0 |
| 10001 | 10100 | 00010 | 0 | 0 |
| 10001 | 01010 | 00100 | 0 | 0 |
| 10001 | 00101 | 01000 | 0 | 0 |
| 10001 | 10000 | 10000 | 0 | 0 |
| 10001 | others | 00000 | 0 | 1 |
| 00111 | 10001 | 00000 | 1 | 0 |
| 00111 | 11010 | 00000 | 1 | 0 |
| 00111 | 01101 | 00001 | 0 | 0 |
| 00111 | 10100 | 00010 | 0 | 0 |
| 00111 | 01010 | 00100 | 0 | 0 |
| 00111 | 00101 | 01000 | 0 | 0 |
| 00111 | 10000 | 10000 | 0 | 0 |
| 00111 | others | 00000 | 0 | 1 |
| 01110 | 01110 | 00000 | 1 | 0 |
| 01110 | 00111 | 00000 | 1 | 0 |
| 01110 | 10001 | 00001 | 0 | 0 |
| 01110 | 11010 | 00010 | 0 | 0 |
| 01110 | 01101 | 00100 | 0 | 0 |
| 01110 | 10100 | 01000 | 0 | 0 |
| 01110 | 01010 | 10000 | 0 | 0 |
| 01110 | others | 00000 | 0 | 1 |
| 11100 | 11100 | 00000 | 1 | 0 |
| 11100 | 01110 | 00000 | 1 | 0 |
| 11100 | 00111 | 00001 | 0 | 0 |
| 11100 | 10001 | 00010 | 0 | 0 |
| 11100 | 11010 | 00100 | 0 | 0 |
| 11100 | 01101 | 01000 | 0 | 0 |
| 11100 | 10100 | 10000 | 0 | 0 |
| 11100 | others | 00000 | 0 | 1 |
| 11101 | 11101 | 00000 | 1 | 0 |
| 11101 | 11100 | 00000 | 1 | 0 |
| 11101 | 01110 | 00001 | 0 | 0 |
| 11101 | 00111 | 00010 | 0 | 0 |
| 11101 | 10001 | 00100 | 0 | 0 |
| 11101 | 11010 | 01000 | 0 | 0 |
| 11101 | 01101 | 10000 | 0 | 0 |
| 11101 | others | 00000 | 0 | 1 |
| 11111 | 11111 | 00000 | 1 | 0 |
| 11111 | 11101 | 00000 | 1 | 0 |
| 11111 | 11100 | 00001 | 0 | 0 |
| 11111 | 01110 | 00010 | 0 | 0 |
| 11111 | 00111 | 00100 | 0 | 0 |
| 11111 | 10001 | 01000 | 0 | 0 |
| 11111 | 11010 | 10000 | 0 | 0 |
| 11111 | others | 00000 | 0 | 1 |
| 11011 | 11011 | 00000 | 1 | 0 |
| 11011 | 11111 | 00000 | 1 | 0 |
| 11011 | 11101 | 00001 | 0 | 0 |
| 11011 | 11100 | 00010 | 0 | 0 |
| 11011 | 01110 | 00100 | 0 | 0 |
| 11011 | 00111 | 01000 | 0 | 0 |
| 11011 | 10001 | 10000 | 0 | 0 |
| 11011 | others | 00000 | 0 | 1 |
| 10011 | 10011 | 00000 | 1 | 0 |
| 10011 | 11011 | 00000 | 1 | 0 |
| 10011 | 11111 | 00001 | 0 | 0 |
| 10011 | 11101 | 00010 | 0 | 0 |
| 10011 | 11100 | 00100 | 0 | 0 |
| 10011 | 01110 | 01000 | 0 | 0 |
| 10011 | 00111 | 10000 | 0 | 0 |
| 10011 | others | 00000 | 0 | 1 |
| 00011 | 00011 | 00000 | 1 | 0 |
| 00011 | 10011 | 00000 | 1 | 0 |
| 00011 | 11011 | 00001 | 0 | 0 |
| 00011 | 11111 | 00010 | 0 | 0 |
| 00011 | 11101 | 00100 | 0 | 0 |
| 00011 | 11100 | 01000 | 0 | 0 |
| 00011 | 01110 | 10000 | 0 | 0 |
| 00011 | others | 00000 | 0 | 1 |
| 00110 | 00110 | 00000 | 1 | 0 |
| 00110 | 00011 | 00000 | 1 | 0 |
| 00110 | 10011 | 00001 | 0 | 0 |
| 00110 | 11011 | 00010 | 0 | 0 |
| 00110 | 11111 | 00100 | 0 | 0 |
| 00110 | 11101 | 01000 | 0 | 0 |
| 00110 | 11100 | 10000 | 0 | 0 |
| 00110 | others | 00000 | 0 | 1 |
| 01100 | 01100 | 00000 | 1 | 0 |
| 01100 | 00110 | 00000 | 1 | 0 |
| 01100 | 00011 | 00001 | 0 | 0 |
| 01100 | 10011 | 00010 | 0 | 0 |
| 01100 | 11011 | 00100 | 0 | 0 |
| 01100 | 11111 | 01000 | 0 | 0 |
| 01100 | 11101 | 10000 | 0 | 0 |
| 01100 | others | 00000 | 0 | 1 |
| 11000 | 11000 | 00000 | 1 | 0 |
| 11000 | 01100 | 00000 | 1 | 0 |
| 11000 | 00110 | 00001 | 0 | 0 |
| 11000 | 00011 | 00010 | 0 | 0 |
| 11000 | 10011 | 00100 | 0 | 0 |
| 11000 | 11011 | 01000 | 0 | 0 |
| 11000 | 11111 | 10000 | 0 | 0 |
| 11000 | others | 00000 | 0 | 1 |

TABLE 8-continued

The Truth Table to do one-hot locate of the error location in GF32 RS decoder

| S1 | S0 | Sel | Other_err | Multi_err |
|---|---|---|---|---|
| 10101 | 10101 | 00000 | 1 | 0 |
| 10101 | 11000 | 00000 | 1 | 0 |
| 10101 | 01100 | 00001 | 0 | 0 |
| 10101 | 00110 | 00010 | 0 | 0 |
| 10101 | 00011 | 00100 | 0 | 0 |
| 10101 | 10011 | 01000 | 0 | 0 |
| 10101 | 11011 | 10000 | 0 | 0 |
| 10101 | others | 00000 | 0 | 1 |
| 01111 | 01111 | 00000 | 1 | 0 |
| 01111 | 10101 | 00000 | 1 | 0 |
| 01111 | 11000 | 00001 | 0 | 0 |
| 01111 | 01100 | 00010 | 0 | 0 |
| 01111 | 00110 | 00100 | 0 | 0 |
| 01111 | 00011 | 01000 | 0 | 0 |
| 01111 | 10011 | 10000 | 0 | 0 |
| 01111 | others | 00000 | 0 | 1 |
| 11110 | 11110 | 00000 | 1 | 0 |
| 11110 | 01111 | 00000 | 1 | 0 |
| 11110 | 10101 | 00001 | 0 | 0 |
| 11110 | 11000 | 00010 | 0 | 0 |
| 11110 | 01100 | 00100 | 0 | 0 |
| 11110 | 00110 | 01000 | 0 | 0 |
| 11110 | 00011 | 10000 | 0 | 0 |
| 11110 | others | 00000 | 0 | 1 |
| 11001 | 11001 | 00000 | 1 | 0 |
| 11001 | 11110 | 00000 | 1 | 0 |
| 11001 | 01111 | 00001 | 0 | 0 |
| 11001 | 10101 | 00010 | 0 | 0 |
| 11001 | 11000 | 00100 | 0 | 0 |
| 11001 | 01100 | 01000 | 0 | 0 |
| 11001 | 00110 | 10000 | 0 | 0 |
| 11001 | others | 00000 | 0 | 1 |
| 10111 | 10111 | 00000 | 1 | 0 |
| 10111 | 11001 | 00000 | 1 | 0 |
| 10111 | 11110 | 00001 | 0 | 0 |
| 10111 | 01111 | 00010 | 0 | 0 |
| 10111 | 10101 | 00100 | 0 | 0 |
| 10111 | 11000 | 01000 | 0 | 0 |
| 10111 | 01100 | 10000 | 0 | 0 |
| 10111 | others | 00000 | 0 | 1 |
| 01011 | 01011 | 00000 | 1 | 0 |
| 01011 | 10111 | 00000 | 1 | 0 |
| 01011 | 11001 | 00001 | 0 | 0 |
| 01011 | 11110 | 00010 | 0 | 0 |
| 01011 | 01111 | 00100 | 0 | 0 |
| 01011 | 10101 | 01000 | 0 | 0 |
| 01011 | 11000 | 10000 | 0 | 0 |
| 01011 | others | 00000 | 0 | 1 |
| 10110 | 10110 | 00000 | 1 | 0 |
| 10110 | 01011 | 00000 | 1 | 0 |
| 10110 | 10111 | 00001 | 0 | 0 |
| 10110 | 11001 | 00010 | 0 | 0 |
| 10110 | 11110 | 00100 | 0 | 0 |
| 10110 | 01111 | 01000 | 0 | 0 |
| 10110 | 10101 | 10000 | 0 | 0 |
| 10110 | others | 00000 | 0 | 1 |
| 01001 | 01001 | 00000 | 1 | 0 |
| 01001 | 10110 | 00000 | 1 | 0 |
| 01001 | 01011 | 00001 | 0 | 0 |
| 01001 | 10111 | 00010 | 0 | 0 |
| 01001 | 11001 | 00100 | 0 | 0 |
| 01001 | 11110 | 01000 | 0 | 0 |
| 01001 | 01111 | 10000 | 0 | 0 |
| 01001 | others | 00000 | 0 | 1 |
| 10010 | 10010 | 00000 | 1 | 0 |
| 10010 | 01001 | 00000 | 1 | 0 |
| 10010 | 10110 | 00001 | 0 | 0 |
| 10010 | 01011 | 00010 | 0 | 0 |
| 10010 | 10111 | 00100 | 0 | 0 |
| 10010 | 11001 | 01000 | 0 | 0 |
| 10010 | 11110 | 10000 | 0 | 0 |
| 10010 | others | 00000 | 0 | 1 |

Figure 12:
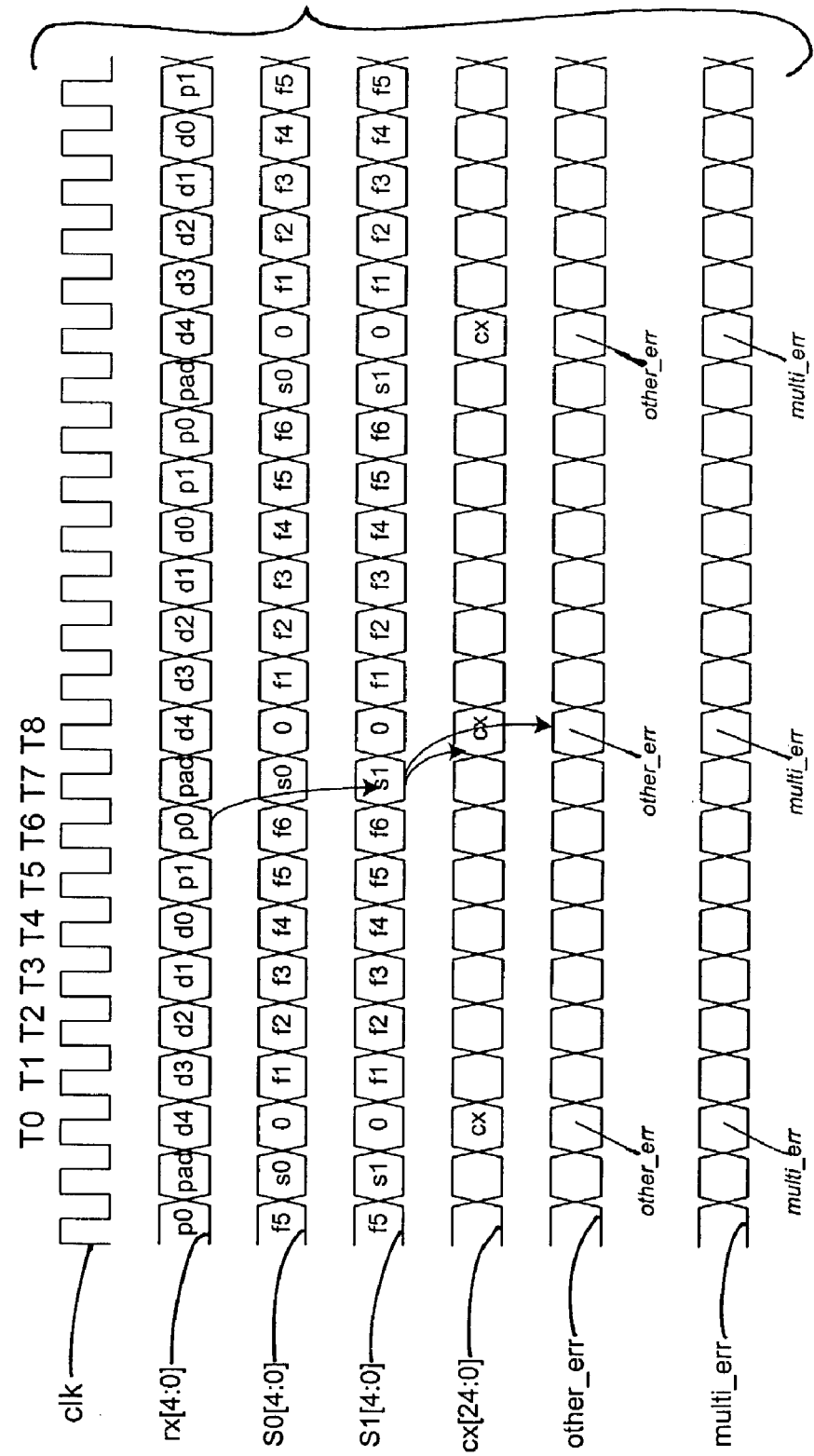
FIG. 12 illustrates, in a timing diagram, behavior of the GF32 RS decoder of FIG. 11.

The timing diagram of the GF32 RS decoder is similar to that of the GF8 RS decoder, and is illustrated in FIG. 12. At time T8, the signal multi_err in FIG. 12 indicates whether the transfer has multi-symbol errors that are uncorrectable.

In addition to the above-described RS encoders, integrated coding circuitry of the type described herein also uses 5B6B and the 3B4B encoders in a transmitter and the corresponding decoders in a receiver, which can be implemented in any manner well known in the art, e.g. as described in "Carrier sense multiple access with collision detection (CSMA/CD) access method and physical layer specifications," pp 927–940, IEEE Std 802.3, 1998 Edition that was incorporated by reference above, or as described in U.S. Pat. No. 4,486,739 granted to Franaszek, et al. also incorporated by reference above.

Several embodiments of the type described herein distinguish over the teachings of U.S. Pat. No. 5,687,181 for a number of reasons as discussed next. Specifically, a design in accordance with the invention partitions a byte in different-sized sub-blocks (3 bits and 5 bits respectively), whereas U.S. Pat. No. 5,687,181 merely describes identical size sub-blocks of 4 bits.

Such an identical partition can only correct one bursty error on the serial links when the one bursty error on the serial link causes a busty error in the 1 byte boundary after 10B8B decoding. In contrast, each byte is partitioned in some embodiments into a 3 bit channel and a 5 bit channel as per the partition of 8B10B. The 3 bit–5 bit partitioning can correct two bursty errors on the serial link when after the 10B8B decoding one of the bursty error is in the 3 bit channel (causing one symbol error) and another bursty error is in the 5 bit channel (also causing one symbol error). Moreover, the 3 bit symbol error and the 5 bit symbol error do not have to be in the same byte.

Furthermore, several embodiments of the type described herein implement RS encoding and decoding differently than U.S. Pat. No. 5,687,181. For this reason several embodiments have stronger error correction ability than and require fewer number of gates than U.S. Pat. No. 5,687,181. Specifically, in the encoder of U.S. Pat. No. 5,687,181 (FIG. 5), the number of Galois Field multiplier equals to the number of input symbols. It is 8 in the example shown in U.S. Pat. No. 5,687,181. It also needs an 8in-1out XOR array in 4 bit width and a 9in-1out XOR array in 4 bit width. It is equivalent to 60 XOR gates (2bit-in-1bit-out).

In contrast, in the embodiments of the invention that are illustrated in FIGS. 5 and 7 that were described above, it is seen that the number of Galois Field (GF) multiplier is 2 in the 3 bit channel, and 2 in the 5 bit channel (4 multipliers in total in two channels). Therefore such embodiments need just 16 XOR gates (2bit-in-1bit-out) in total (add 3 bit channel encoder and 5 bit channel encoder together).

In the decoder of U.S. Pat. No. 5,687,181 (FIG. 6), the number of Galois Field multiplier equals to the number of input symbols. It is 8 in the example shown in U.S. Pat. No. 5,687,181. It also needs bigger decoder to find the error location and error magnitude. The error locater shown in FIG. 9 in U.S. Pat. No. 5,687,181 is 8 bit-in-32 bit-out.

In the decoder of certain embodiments of the invention illustrated in FIGS. 9 and 11, the number of Galois Field (GF) multiplier is 1 in the 3 bit channel and 1 in the 5 bit channel. In such embodiments, the error magnitudes are already found in the syndrome S0, so, the decoder for error location is small: e.g. it is 6 bit-in-6 bit-out in the 3 bit channel decoder and 10 bit-in-7 bit-out in the 5 bit channel.

When the number of symbols in the user data changes, both the encoder and decoder of the U.S. Pat. No. 5,687, 181A1 (FIGS. 5 and 6) have to be redesigned. And since the number of Galois Field multiplier equals to the number of input symbols, the design cannot be configurable, and increase the number of input symbols is very costly.

In several embodiments of the invention, when the number of symbols in the user data changes, the datapath of the encoder (FIGS. 5 and 7) do not need to change, only the number of the registers in the counter needs change. In the decoder (FIG. 9, FIG. 11), only the error locator and the counter need change. For this reason several embodiments are configurable if the counter in both the encoder and decoder are designed configurable, and the error locator in the decoder implemented in a relatively larger memory. At the same time, increase the number of symbols in the user data before encoding is less expensive than the design of U.S. Pat. No. 5,687,181A1.

Several embodiments of the type described herein achieve DC balance, strong error correction ability, fast encoding, decoding and small circuits in integrated circuit chip design. In several such embodiments, the Reed-Solomon encoder and decoder are designed as described herein to meet very low latency requirements, and moreover the Reed-Solomon encoder and decoder also use small amount of logic. In some cases, the following requirements are all met in a single design (e.g. illustrated in FIGS. 5, 7, 9 and 11):

(1) at high speed, the signals transferred on the serial links shall have equal number of Os and is in a period of time;

(2) the receiver can correct errors that happened during signal transfer;

(3) short time to do encoding and decoding (i.e. low latency); and (4) small amount of logic to perform encode and decode.

Such embodiments meet these four requirements all at the same time, making small designs possible, especially in integrated circuit design.

Several embodiments have the following three advantages over the prior art: (1) the integrated coding is DC balanced with strong error correction ability; (this coding can correct up to two symbol errors if one symbol error is in the GF8 channel and another symbol error is in the GF32 channel; and it can also detect some multiple symbol errors if the coded data length is less than the maximum data length); (2) the integrated coding design has low latency, the RS encoding latency is 2 clocks, and the RS decoding latency is 2 clocks (which is believed to be the minimum latency that this type of coding can achieve in synchronous digital design), and (3) by choosing a generator polynomial and doing optimization in the decoder as described herein, the circuits of the one symbol error correction encoder and decoder are much smaller than the previous Reed-Solomon encoders and decoders to do multiple symbol error correction.

Numerous variations and modifications of the embodiments, examples, illustrations and implementations described herein will be apparent to the skilled artisan in view of the disclosure.

Although several embodiments have been described as achieving DC balance, other embodiments in which DC balance is not important may be optimized for other conditions relevant to the transmission medium over which the coded signal is to be transmitted. Furthermore, although several embodiments use RS coding as the data coding method, other embodiments may use any error correction coding (ECC) method well known in the art.

Numerous such adaptations, variations and modifications of the embodiments, examples, illustrations and implementations described herein are encompassed by the attached claims.

The invention claimed is:

1. A method of encoding data by interleaving acts of a data coding method among acts of a line coding method, the method comprising:
(a) performing at least one act of the line coding method on the data to obtain one or more intermediate line coded results;
(b) performing at least one act of the data coding method on the "one or more intermediate line coded results" generated by (a), to obtain one or more data coded results; and
(c) performing at least one act remaining in the line coding method on the "one or more data coded results" generated by (b).

2. The method of claim 1 wherein prior to encoding, the data comprises a plurality of n bit blocks, and wherein:
performance of (a) of claim 1 comprises partitioning each n bit block into a plurality of sub-blocks, each sub-block comprising a plurality of contiguous bits different in number than another sub-block;
performance of (b) of claim 1 comprises applying forward error correction (FEC) encoding to each sub-block independent of another sub-block, to yield a plurality of FEC encoded sub-blocks; and
performance of (c) of claim 1 comprises encoding each FEC encoded sub-block by adding a bit to obtain an output sub-block, wherein at least one bit being added is selected to enhance DC balance across at least a group of output sub-blocks.

3. The method of claim 2 wherein each n bit block is partitioned into two sub-blocks, a sub-block of x bits and a sub-block of n-x bits and performance of (b) of claim 1 comprises:
(x) applying forward error correction (FEC) encoding to the sub-block x bits; and
(y) applying FEC encoding to the sub-block of n-x bits; wherein act (x) is performed independent of act (y).

4. The method of claim 3 wherein the value of n is 8, and wherein:
FEC encoding in act (x) is performed on a 3 bit sub-block; and
FEC encoding in act (y) is performed on a 5 bit sub-block.

5. The method of claim 4 wherein:
the FEC encoding is Reed-Solomon.

6. The method of claim 5 wherein:
Reed-Solomon encoding for the sub-block of 3 bits uses Galois Field GF8, with a primitive polynomial selected to be either of 1101 and 1011; and
Reed-Solomon encoding for the sub-block of 5 bits uses Galois Field GF32, with a primitive polynomial selected to be any of 101001, 100101, 111101, 111011, 110111 and 101111.

7. The method of claim 6 wherein:
the Reed-Solomon encoding for the sub-block of 3 bits uses generator polynomial; and
the Reed-Solomon encoding for the sub-block of 5 bits uses generator polynomial.

8. The method of claim 7 wherein Reed-Solomon encoding for the sub-block of 3 bits and Reed-Solomon encoding for the sub-block of 5 bits are performed at least partially concurrently.

9. The method of claim 7 wherein during Reed-Solomon encoding for the sub-block of 3 bits, multiplication with $\alpha$ has

| Input | Output |
| --- | --- |
| 000 | 000 |
| 001 | 010 |
| 010 | 100 |
| 100 | 011 |
| 011 | 110 |
| 110 | 111 |
| 111 | 101 |
| 101 | 001 | and multiplication with $\alpha^3$ has

| Input | Output |
| --- | --- |
| 000 | 000 |
| 001 | 011 |
| 010 | 110 |
| 100 | 111 |
| 011 | 101 |
| 110 | 001 |
| 111 | 010 |
| 101 | 100. |

10. The method of claim 9 wherein:
each of said multiplications is implemented as a look-up table in memory.

11. The method of claim 9 wherein:
each of said multiplications is implemented as a block of combinational logic.

12. The method of claim 7 wherein during Reed-Solomon encoding for the sub-block of 5 bits,
multiplication with $\alpha$ has

| Input | Output |
| --- | --- |
| 00000 | 00000 |
| 00001 | 00010 |
| 00010 | 00100 |
| 00100 | 01000 |
| 01000 | 10000 |
| 10000 | 00101 |
| 00101 | 01010 |
| 01010 | 10100 |
| 10100 | 01101 |
| 01101 | 11010 |
| 11010 | 10001 |
| 10001 | 00111 |
| 00111 | 01110 |
| 01110 | 11100 |
| 11100 | 11101 |
| 11101 | 11111 |
| 11111 | 11011 |
| 11011 | 10011 |
| 10011 | 00011 |
| 00011 | 00110 |
| 00110 | 01100 |
| 01100 | 11000 |
| 11000 | 10101 |
| 10101 | 01111 |
| 01111 | 11110 |
| 11110 | 11001 |
| 11001 | 10111 |
| 10111 | 01011 |
| 01011 | 10110 |
| 10110 | 01001 |
| 01001 | 10010 |
| 10010 | 00001 | and multiplication with $\alpha^{18}$ has

| Input | Output |
| --- | --- |
| 00000 | 00000 |
| 00001 | 00011 |
| 00010 | 00110 |
| 00100 | 01100 |
| 01000 | 11000 |
| 10000 | 10101 |
| 00101 | 01111 |
| 01010 | 11110 |
| 10100 | 11001 |
| 01101 | 10111 |
| 11010 | 01011 |
| 10001 | 10110 |
| 00111 | 01001 |
| 01110 | 10010 |
| 11100 | 00001 |
| 11101 | 00010 |
| 11111 | 00100 |
| 11011 | 01000 |
| 10011 | 10000 |
| 00011 | 00101 |
| 00110 | 01010 |
| 01100 | 10100 |
| 11000 | 01101 |
| 10101 | 11010 |
| 01111 | 10001 |
| 11110 | 00111 |
| 11001 | 01110 |
| 10111 | 11100 |
| 01011 | 11101 |
| 10110 | 11111 |
| 01001 | 11011 |
| 10010 | 10011. |

13. An apparatus for encoding data, the apparatus comprising:
means for partitioning an n bit input block into an x bits sub-block and an n-x bits sub-block, each sub-block consisting of contiguous bits;
means for FEC encoding the x bits sub-block, coupled to the means for partitioning to receive the x bits sub-block therefrom;
means for FEC encoding the n-x bits sub-block, coupled to the means for partitioning to receive the n-x bits sub-block therefrom;
means for encoding the n-x bits sub-block and the x bits sub-block in accordance with 8B/10B encoding, said means for encoding being coupled to each of the means for FEC encoding to receive therefrom FEC encoded n-x bits sub-block and FEC encoded x bits sub-block.

14. The apparatus of claim 13 further comprising:
a serializer coupled to the means for encoding to receive therefrom FEC coded and 8B/10B coded data for supply to a serial link;
a deserializer coupled to the serial link;
means for decoding coupled to the deserializer to decode data in accordance with 8B/10B encoding and generate a decoded x bits sub-block and a decoded n-x bits sub-block;
means for FEC decoding the decoded x bits sub-block, coupled to the means for decoding to receive the decoded x bits sub-block therefrom; and
means for FEC decoding the decoded n-x bits sub-block, coupled to the means for decoding to receive the decoded n-x bits sub-block therefrom;
wherein output from the means for FEC decoding regenerate the n bit input block in case of no errors and also in case of one error in the decoded n-x bits sub-block and one error in the decoded x bits sub-block.

15. The apparatus of claim 13 wherein:
each means for FEC encoding comprises means for Reed Solomon encoding.

16. An apparatus for encoding data, the apparatus comprising:
a line encoding block partitioner having an n bits input bus, an x bits output bus and an n-x bits output bus for carrying an x bits sub-block and an n-x bits sub-block respectively;
an x bits data coder coupled to the x bits output bus to receive therefrom the x bits sub-block;
an n-x bits data coder coupled to the n-x bits output bus to receive therefrom the n-x bits sub-block;
an x bits line coder coupled to the x bits data coder to receive therefrom a data coded x-bit sub-block; and
an n-x bits line coder coupled to the n-x bits data coder to receive therefrom a data coded n-x bits sub-block;
wherein the x bits line coder and the n-x bits line coder are coupled to one another, to transfer a signal therebetween for selection of a bit to be added to at least one of the data coded x bits sub-block and the data coded n-x bits sub-block.

17. The apparatus of claim 16 wherein:
each data coder comprises a look-up table in memory.

18. The apparatus of claim 16 wherein:
one of the data coders uses a primitive polynomial selected to be either of 1101 and 1011.

19. The apparatus of claim 16 further comprising:
a serializer coupled to each of the line coders to receive therefrom data for supply to serial link.

20. The apparatus of claim 16, wherein:
the line encoding block partitioner comprises an 8B/10B partitioner; and each data coder comprises a Galois Field encoder.

* * * * *